(12) United States Patent
Uchibe et al.

(10) Patent No.: US 12,550,293 B2
(45) Date of Patent: Feb. 10, 2026

(54) COOLER AND SEMICONDUCTOR DEVICE

(71) Applicant: FUJI ELECTRIC CO., LTD., Kawasaki (JP)

(72) Inventors: Ginji Uchibe, Hino (JP); Yasutaka Sanuki, Sagamihara (JP); Yuji Suzuki, Hino (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 469 days.

(21) Appl. No.: 17/993,478

(22) Filed: Nov. 23, 2022

(65) Prior Publication Data

US 2023/0232581 A1 Jul. 20, 2023

(30) Foreign Application Priority Data

Jan. 19, 2022 (JP) .................................. 2022-006363

(51) Int. Cl.
*H05K 7/20* (2006.01)
*H01L 23/367* (2006.01)
*H02M 7/00* (2006.01)

(52) U.S. Cl.
CPC ....... *H05K 7/20272* (2013.01); *H01L 23/367* (2013.01); *H02M 7/003* (2013.01); *H05K 7/20145* (2013.01)

(58) Field of Classification Search
CPC .......... H05K 7/20927; H05K 7/20272; H05K 7/20145; H01L 23/473; H01L 23/367; H02M 7/003

See application file for complete search history.

(56) References Cited

U.S. PATENT DOCUMENTS 5,016,090 A * 5/1991 Galyon ............... H01L 23/4336
257/714
9,472,488 B2 * 10/2016 Gohara ..................... F28F 3/00
(Continued)

FOREIGN PATENT DOCUMENTS

JP 2008-172024 A 7/2008
JP 2008-294068 A 12/2008
(Continued)

OTHER PUBLICATIONS

Office Action, issued Apr. 12, 2022, in corresponding Japanese patent application No. 2022-006363 with machine translation (11 pp.).

(Continued)

Primary Examiner — Michael A Matey

(57) ABSTRACT

A cooler includes: a cooling wall including a first surface and a second surface; a first path extending in a first direction and having an inlet for a refrigerant; a second path extending in the first direction and having an outlet for the refrigerant; a cooling path causing the first path to communicate with the second path in a second direction intersecting the first direction; a partition spaced from the cooling wall in a third direction perpendicular to the first surface, separating the first and second paths from the cooling paths, and including a third surface constituting a part of a wall surface of the first path, the third surface including a first portion and a second portion differing from the first portion in position in the third direction. The first path includes a first gas retaining space defined by the first and second portions.

9 Claims, 11 Drawing Sheets

(56) References Cited

U.S. PATENT DOCUMENTS

| | | | |
|---|---|---|---|
| 2008/0169088 A1 | 7/2008 | Aoki et al. | |
| 2008/0237847 A1* | 10/2008 | Nakanishi | F28F 3/12 |
| | | | 257/722 |
| 2008/0291628 A1* | 11/2008 | Aoki | H01L 23/473 |
| | | | 361/699 |
| 2009/0065178 A1* | 3/2009 | Kasezawa | H01L 23/473 |
| | | | 165/104.19 |
| 2010/0172091 A1* | 7/2010 | Nishiura | H01L 23/473 |
| | | | 361/689 |
| 2012/0139096 A1* | 6/2012 | Gohara | H01L 23/3735 |
| | | | 257/E23.101 |
| 2014/0043765 A1 | 2/2014 | Gohara et al. | |
| 2015/0061111 A1* | 3/2015 | Nagai | H01L 23/473 |
| | | | 257/714 |
| 2015/0122465 A1* | 5/2015 | Mori | F28F 9/0243 |
| | | | 165/104.33 |
| 2016/0183409 A1* | 6/2016 | Zhou | H01L 23/4735 |
| | | | 165/104.31 |
| 2021/0057307 A1* | 2/2021 | Ushijima | H01L 23/473 |
| 2022/0181981 A1 | 6/2022 | Suzuki et al. | |
| 2023/0230899 A1* | 7/2023 | Uchibe | H05K 7/20254 |
| | | | 257/714 |
| 2023/0232599 A1 | 7/2023 | Suzuki et al. | |

FOREIGN PATENT DOCUMENTS

| | | |
|---|---|---|
| JP | 2011-217553 A | 10/2011 |
| JP | 2012-129280 A | 7/2012 |
| JP | 2020-73845 A | 5/2020 |
| JP | 2021-27097 A | 2/2021 |
| JP | 2021-048753 A | 3/2021 |
| JP | 2021-141729 A | 9/2021 |
| WO | 2012/147544 A1 | 11/2012 |

OTHER PUBLICATIONS

U.S. Final Office Action dated Dec. 19, 2024 issued in U.S. Appl. No. 18/070,971.
U.S. Non-Final Office Action dated Aug. 1, 2024 issued in U.S. Appl. No. 18/070,971.
Japanese Office Action dated Apr. 12, 2022 issued in Japanese Application No. 2022-00634.
Japanese Office Action dated Apr. 5, 2022 issued in Japanese Application No. 2022-006342.
Japanese Office Action dated Apr. 12, 2022 issued in Japanese Application No. 2022-006384.
U.S. Office Action dated Mar. 24, 2025 issued in U.S. Appl. No. 18/070,971.

* cited by examiner

COOLER AND SEMICONDUCTOR DEVICE

CROSS REFERENCE TO RELATED APPLICATION

This application is based on, and claims priority from, Japanese Patent Application No. 2022-006363, filed Jan. 19, 2022, the entire contents of which are incorporated herein by reference.

BACKGROUND

Technical Field

The disclosure relates to a cooler and to a semiconductor device.

Related Art

Semiconductor devices, such as power converters, are known, that convert DC power to AC power. For example, Japanese Patent Application Laid-Open Publication No. 2011-141729 discloses a power converter that includes a power conversion circuit, which converts DC power to AC power, and a cooler, which cools a switching element included in the power conversion circuit. For example, the cooler includes a flow path for a refrigerant used to cool a heat generator such as a switching element. The heat generator is arranged on a cooling wall among a plurality of walls that defines the flow path. If gas is produced in a refrigerant or enters a refrigerant due to boiling of the refrigerant or for other reasons, the gas may remain in a flow path for the refrigerant. If the gas in the flow path remains in contact with a cooling wall, the cooling efficiency of the cooler may decrease.

SUMMARY

In view of the circumstances described above, an object of one aspect according to the present disclosure is to lessen the decrease in the cooling efficiency of a cooler.

A cooler according to an aspect of the present disclosure includes a cooling body extending in a first direction. The cooling body includes: a cooling wall including a first surface on which a heat generator is arranged, and a second surface opposite to the first surface; a first flow path extending in the first direction and having one end from which a refrigerant flows into the first flow path; a second flow path extending in the first direction and having one end from which the refrigerant is drained; a plurality of cooling paths each having a wall surface, a part of the wall surface being constituted by the second surface; and a partition spaced apart from the cooling wall in a third direction perpendicular to the first surface, the partition separating the first flow path from the plurality of cooling paths, and the partition separating the second flow path from the plurality of cooling paths. The plurality of cooling paths is arrayed in the first direction, each of the plurality of cooling paths extending in a second direction intersecting the first direction, each of the plurality of cooling paths being between the first flow path and the cooling wall in the third direction, and each of the plurality of cooling paths being between the second flow path and the cooling wall in the third direction. Each of the plurality of cooling paths causes the first flow path and the second flow path to communicate with each other in the second direction. The partition includes a third surface constituting a part of a wall surface of the first flow path, the third surface including a first portion and a second portion, and a position of the first portion in the third direction being different from a position of the second portion in the third direction. The first flow path includes a first gas-retaining space defined by the first portion and the second portion.

A cooler according to another aspect of the present disclosure includes a cooling body extending in a first direction. The cooling body includes: a cooling wall including a first surface on which a heat generator is arranged, and a second surface opposite to the first surface; a first flow path extending in the first direction and having one end from which a refrigerant flows into the first flow path; and a second flow path extending in the first direction and having one end from which the refrigerant is drained; a plurality of cooling paths each having a wall surface, a part of the wall surface being constituted by the second surface. The plurality of cooling paths is arrayed in the first direction, each of the plurality of cooling paths extending in a second direction intersecting the first direction, each of the plurality of cooling paths being between the first flow path and the cooling wall in the third direction, and each of the plurality of cooling paths being between the second flow path and the cooling wall in the third direction. Each of the plurality of cooling paths causes the first flow path and the second flow path to communicate with each other in the second direction. The second surface includes a peripheral portion close to the second flow path in the second direction, the peripheral portion close to the second flow path being a tilted surface or a curved surface.

A semiconductor device according to an aspect of the present disclosure includes the cooler described above.

DESCRIPTION OF EMBODIMENTS

Embodiments according to the present disclosure will be described with reference to the drawings. In each drawing, dimensions and scales of elements may differ from those of actual products. The embodiments described below include various technical limitations; however, the scope of the present disclosure is not limited to the embodiments described below unless the following explanation includes a description that specifically limits the scope of the present disclosure.

A. Embodiments

Embodiments according to the present disclosure will be described below. First, an example of an outline of a power converter 10 according to a first embodiment will be described with reference to FIG. 1.

A1: First Embodiment

Figure 1:
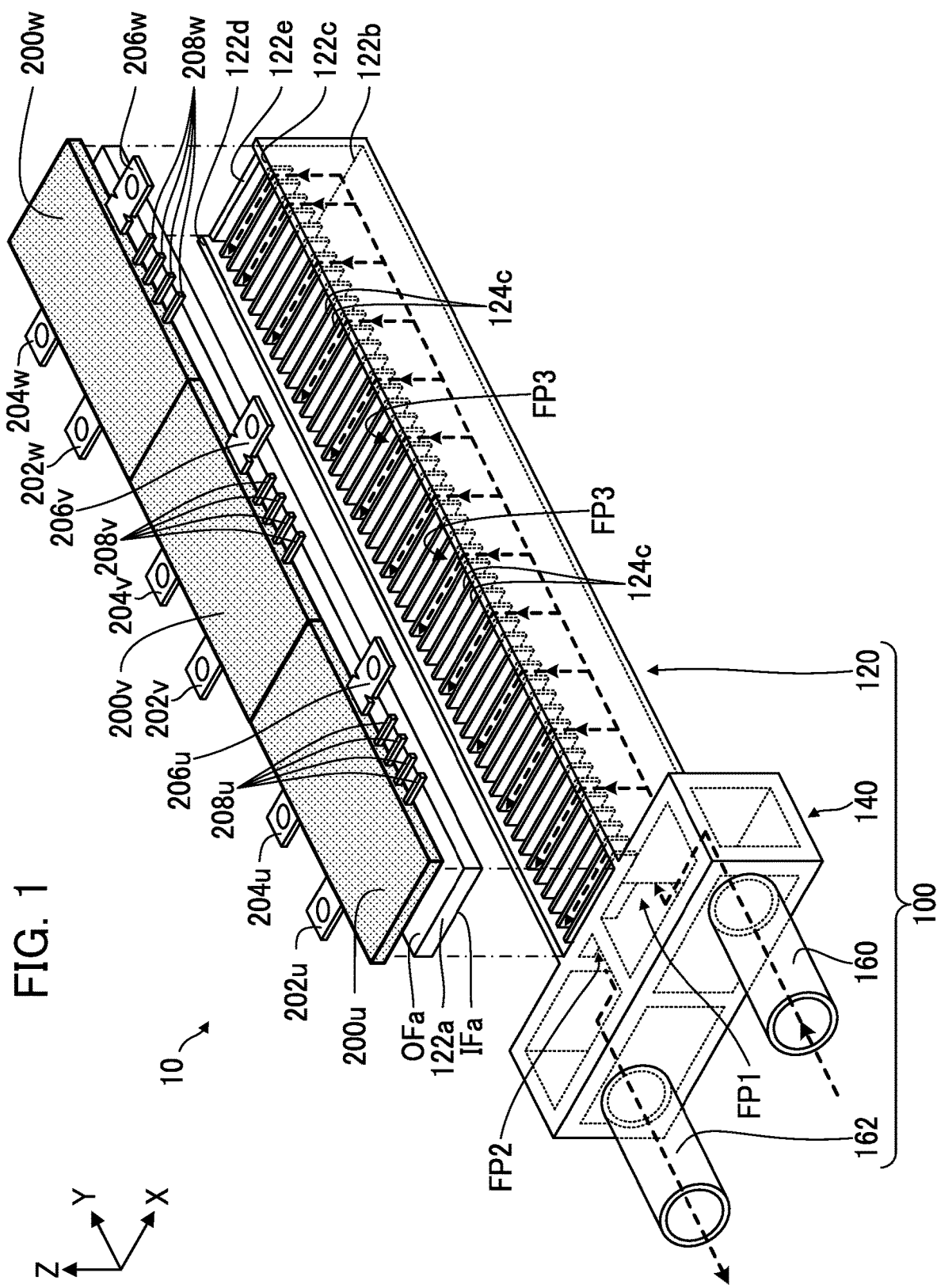
FIG. 1 is an exploded perspective view schematically showing a main part of a power converter according to a first embodiment.

FIG. 1 is an exploded perspective view schematically showing a main part of the power converter 10 according to the first embodiment.

In the following description, a three-axis rectangular coordinate system having an X-axis, a Y-axis, and a Z-axis perpendicular to each other is defined for convenience of explanation. In the following description, a direction indicated by an arrow of the X-axis is referred to as the +X direction, and a direction opposite to the +X direction is referred to as the −X direction. A direction indicated by an arrow of the Y-axis is referred to as the +Y direction, and a direction opposite to the +Y direction is referred to as the −Y direction. A direction indicated by an arrow of the Z-axis is referred to as the +Z direction, and a direction opposite to the +Z direction is referred to as the −Z direction. In the following description, the +Y direction and the −Y direction may be referred to as the Y direction without distinction between them, and the +X direction and the −X direction may be referred to as the X direction without distinction between them. The +Z direction and the −Z direction may be referred to as the Z direction without distinction between them.

Each of the +Y direction and the −Y direction is an example of a "first direction", each of the +X direction and the −X direction is an example of a "second direction," and each of the +Z direction and the −Z direction is an example of a "third direction." In the following description, viewing a target from a direction may be referred to as a plan view.

The power converter 10 may be a freely chosen power semiconductor device such as an inverter, a converter, etc. The power converter 10 is an example of a "semiconductor device." In the embodiment, the power converter 10 is assumed to be a power semiconductor device that converts DC power, which is input to the power converter 10, into three-phase AC power having a U-phase, a V-phase, and a W-phase.

For example, the power converter 10 includes three semiconductor modules 200u, 200v, and 200w, which are configured to convert DC power into AC power, and a cooler 100, which is configured to cool the semiconductor modules 200u, 200v, and 200w. The semiconductor modules 200u, 200v, and 200w are each an example of a "heat generator."

Each of the semiconductor modules 200u, 200v, and 200w is a power semiconductor module that includes a power semiconductor chip, which includes a power semiconductor element such as a switching element, and a resin case, which houses the power semiconductor chip. Examples of the switching element include a power metal oxide semiconductor field effect transistor (MOSFET), an insulated gate bipolar transistor (IGBT), etc.

The semiconductor module 200u includes, for example, input terminals 202u and 204u, an output terminal 206u, and a plurality of control terminals 208u. For example, the semiconductor module 200u converts DC power input to the input terminals 202u and 204u into U-phase AC power to output the U-phase AC power from the output terminal 206u. Electric potential of the input terminal 202u is higher than that of the input terminal 204u, for example. Furthermore, each of the control terminals 208u receives a control signal for controlling an operation of the switching element, etc., in the semiconductor module 200u.

Each of the semiconductor modules 200v and 200w is similar to the semiconductor module 200u except for outputting V-phase AC power or W-phase AC power of three-phase AC power. For example, the semiconductor module 200v includes input terminals 202v and 204v, an output terminal 206v, and a plurality of control terminals 208v; in addition, the semiconductor module 200v outputs V-phase AC power from the output terminal 206v. The semiconductor module 200w includes input terminals 202w and 204w, an output terminal 206w, and a plurality of control terminals 208w; in addition, the semiconductor module 200w outputs W-phase AC power from the output terminal 206w, for example.

In the following description, the semiconductor modules 200u, 200v, and 200w may be generally referred to as a semiconductor module 200. The input terminals 202u, 202v, and 202w may be generally referred to as input terminals 202, the input terminals 204u, 204v, and 204w may be generally referred to as input terminals 204, and the output terminals 206u, 206v, and 206w may be generally referred to as output terminals 206.

The cooler 100 includes a body 120 extending in the Y direction, a supply pipe 160 for supplying a refrigerant to the body 120, a drain pipe 162 for draining the refrigerant from the body 120, and a head 140 for connecting the supply pipe 160 and the drain pipe 162 to the body 120. Dashed arrows in FIG. 1 each indicate an example of flow of the refrigerant. In the embodiment, it is assumed that the refrigerant is a liquid such as water.

The body 120 is an example of a "cooling body." With reference to FIG. 1, an outline of the body 120 will be described. Details of the body 120 will be described with reference to FIG. 3 and FIG. 4 described below. The head 140 will be described with reference to FIG. 2 described later.

The body 120 is, for example, a hollow structure having a shape of a rectangular parallelepiped extending in the Y direction. For example, the body 120 includes an inflow path FP1 extending in the Y direction and having one end from which the refrigerant flows into the inflow path FP1, an outflow path FP2 extending in the Y direction and having one end from which the refrigerant is drained, and a plurality of cooling paths FP3. The other end (an end in the +Y direction) of each of the inflow path FP1 and the outflow path FP2 is defined by an outer wall 122e. The inflow path FP1 is an example of a "first flow path," whereas the outflow path FP2 is an example of a "second flow path."

Furthermore, the body 120 includes an outer wall 122a on which the semiconductor module 200 is arranged. The outer wall 122a includes an outer surface OFa, on which the semiconductor module 200 is arranged, and an inner surface IFa opposite to the outer surface OFa. The inner surface IFa constitutes a part of a wall surface of each of the plurality of cooling paths FP3. The outer wall 122a is an example of a "cooling wall," the outer surface OFa is an example of a "first surface," and the inner surface IFa is an example of a "second surface."

The plurality of cooling paths FP3 is arrayed in the Y direction, and each of the plurality of cooling paths FP3 extends in the X direction intersecting the Y direction. One end and the other end of each of the plurality of cooling paths FP3 are defined by an outer wall 122c and an outer wall 122d, respectively. Furthermore, the body 120 includes a plurality of partitions 124c arrayed in the Y direction, and each of the plurality of partitions 124c extends in the X direction, for example. Two adjacent cooling paths FP3 among the plurality of cooling paths FP3 are separated from each other by a partition 124c between the two adjacent cooling paths FP3.

Figure 4:
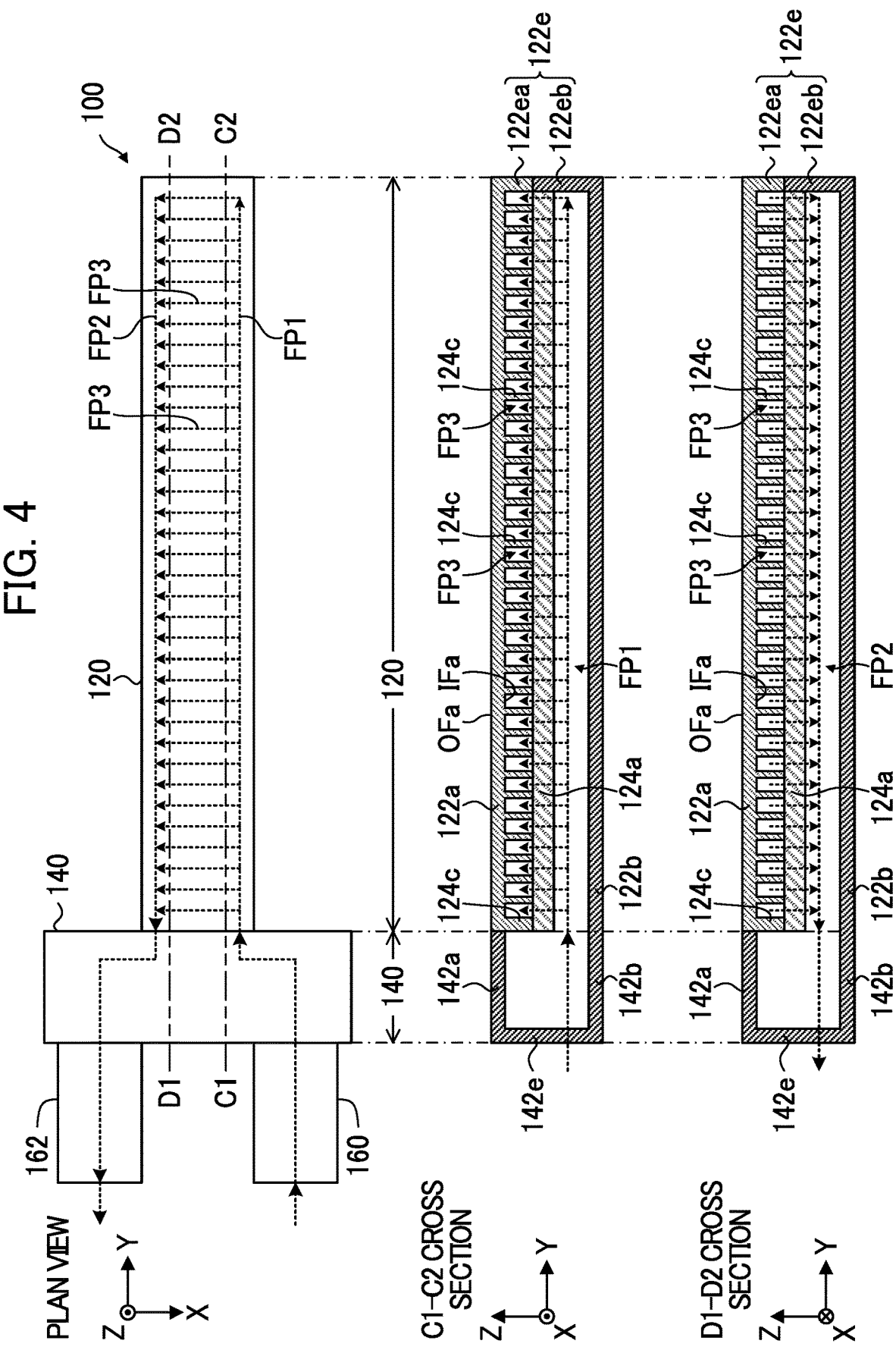
FIG. 4 is another diagram explaining the body shown in FIG. 1.

To facilitate understanding of the flow of the refrigerant, FIG. 1 shows the plurality of partitions 124c separated from the outer wall 122a; however, in the embodiment, it is assumed that the plurality of partitions 124c is formed integrally with the outer wall 122a as shown in FIG. 4. The number of partitions 124c is not limited to two or more. For example, in a case in which the number of cooling paths FP3 is two, the number of partitions 124c may be one.

The plurality of cooling paths FP3 are positioned not only between the inflow path FP1 and the outer wall 122a in the Z direction perpendicular to the outer surface OFa, but also between the outflow path FP2 and the outer wall 122a in the Z direction. Each of the plurality of cooling paths FP3 causes the inflow path FP1 and the outflow path FP2 to communicate with each other in the X direction.

The cooler 100 cools the semiconductor module 200, which is arranged on the outer surface OFa of the outer wall 122a, with the refrigerant flowing through the plurality of cooling paths FP3, and each of the plurality of cooling paths FP3 has a part of the wall surface that is constituted by the inner surface IFa of the outer wall 122a. For example, heat generated in the semiconductor module 200 is transferred to the refrigerant through the outer wall 122a.

The body 120 is formed of a material having excellent thermal conductivity. An example of the material of the body 120 include metals such as copper, aluminum, or an alloy of any thereof. The head 140, the supply pipe 160, and the drain pipe 162 are formed of the same material as the body 120, for example. In other words, examples of a material of each of the head 140, the supply pipe 160, and the drain pipe 162 include metals such as copper, aluminum, or an alloy of any thereof. One, some, or all of the head 140, the supply pipe 160, and the drain pipe 162 may be formed of a material different from that of the body 120.

The shape of the body 120 is not limited to the rectangular parallelepiped extending in the Y direction. For example, the shape of the body 120 in plan view from the −Y direction may be a shape having a curve. In other words, the outer walls 122c and 122d may be curved.

Next, the head 140 will be described with reference to FIG. 2.

Figure 2:
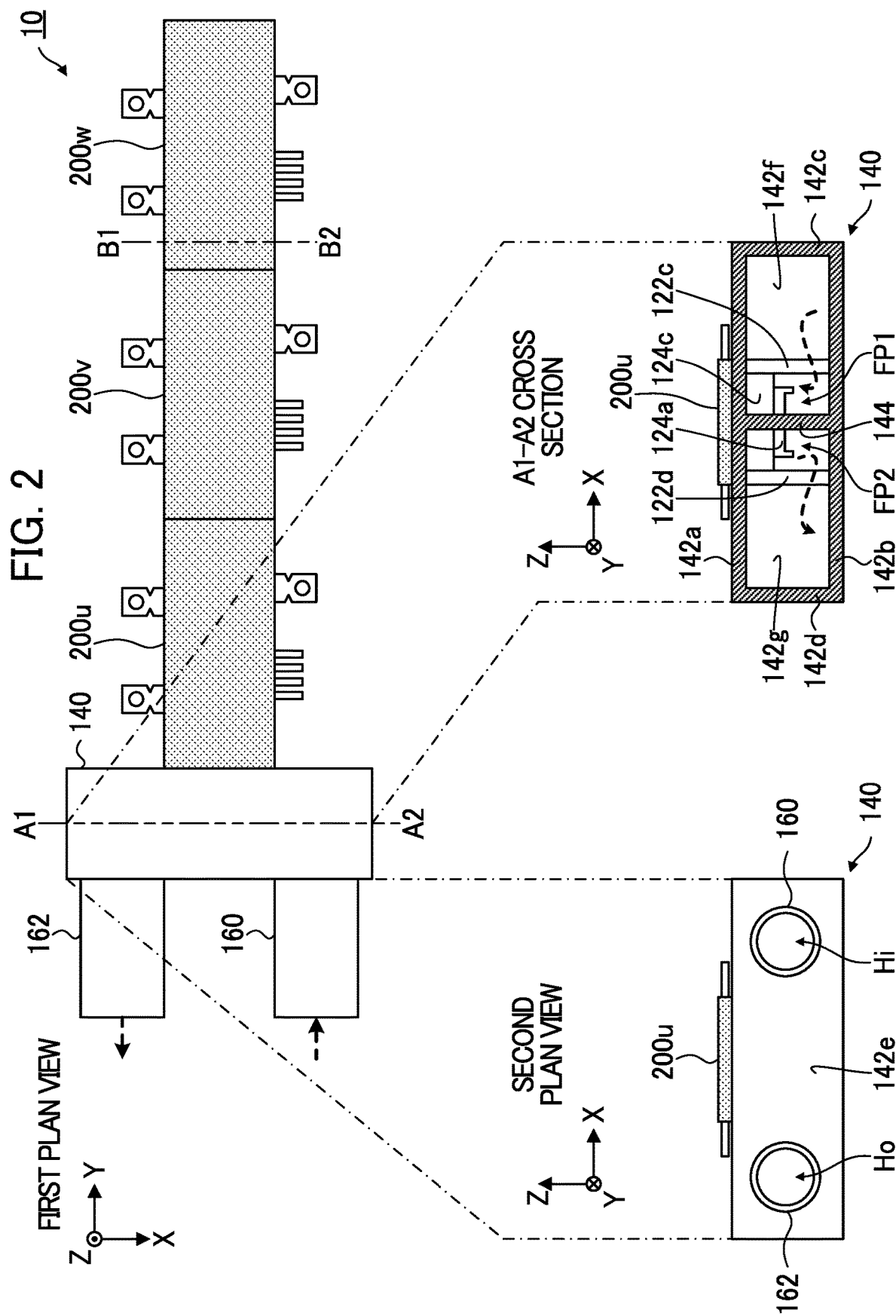
FIG. 2 is a diagram explaining a head shown in FIG. 1.

FIG. 2 is a diagram explaining the head 140 shown in FIG. 1. A first plan view in FIG. 2 is a plan view of the cooler 100 and the semiconductor module 200 viewed from the +Z direction, and a second plan view is a plan view of the cooler 100 and the semiconductor module 200 viewed from the −Y direction. An A1-A2 cross section in FIG. 2 is a cross section of the cooler 100 taken along line A1-A2 in the first plan view. In FIG. 2, reference signs such as the input terminals 202u are omitted for simplicity. In the drawings following FIG. 2, reference signs such as the input terminal 202u are appropriately omitted.

The head 140 is, for example, a hollow rectangular parallelepiped that includes an opening communicating with the inflow path FP1, an opening communicating with the outflow path FP2, a supply port Hi, and a drain port Ho.

As shown in the second plan view, the supply port Hi and the drain port Ho are each a through-hole formed in an outer wall 142e substantially parallel to an X-Z plane. Descriptions such as "substantially parallel" mean concepts including error. For example, "substantially parallel" may mean parallel in design. The supply pipe 160 and the drain pipe 162 are connected to the outer wall 142e. For example, the supply pipe 160 is connected to the outer wall 142e so that a flow path in the supply pipe 160 communicates with the supply port Hi, and the drain pipe 162 is connected to the outer wall 142e so that a flow path in the drain pipe 162 communicates with the drain port Ho.

Furthermore, as shown in the A1-A2 cross section, the head 140 includes, in addition to the outer wall 142e, outer walls 142a and 142b substantially parallel to an X-Y plane, outer walls 142c and 142d substantially parallel to an Y-Z plane, and outer walls 142f and 142g substantially parallel to the X-Z plane. Furthermore, the head 140 includes a partition 144 substantially parallel to the Y-Z plane.

The outer walls 142f and 142g are arranged, for example, apart from the outer wall 142e in the +Y direction, and are connected to the outer walls 122c and 122d of the body 120, respectively. The partition 144, which separates a flow path from the supply port Hi to the inflow path FP1 and a flow path from the outflow path FP2 to the drain port Ho from each other, is arranged between the outer walls 122c and 122d of the body 120 in the X direction. The partition 144 is connected to the outer walls 142a and 142b, a partition 124c closest to the head 140 among the plurality of partitions 124c of the body 120, a partition 124a of the body 120, and a partition 124b of the body 120 described below in FIG. 3, for example.

The shape of the head 140 is not limited to the shape shown in FIG. 2. For example, the shape of the head 140 in plan view from the −Y direction may be a shape having a curve. In other words, the outer walls 142c and 142d may be curved.

Next, the body 120 will be described with reference to FIG. 3 and FIG. 4.

Figure 3:
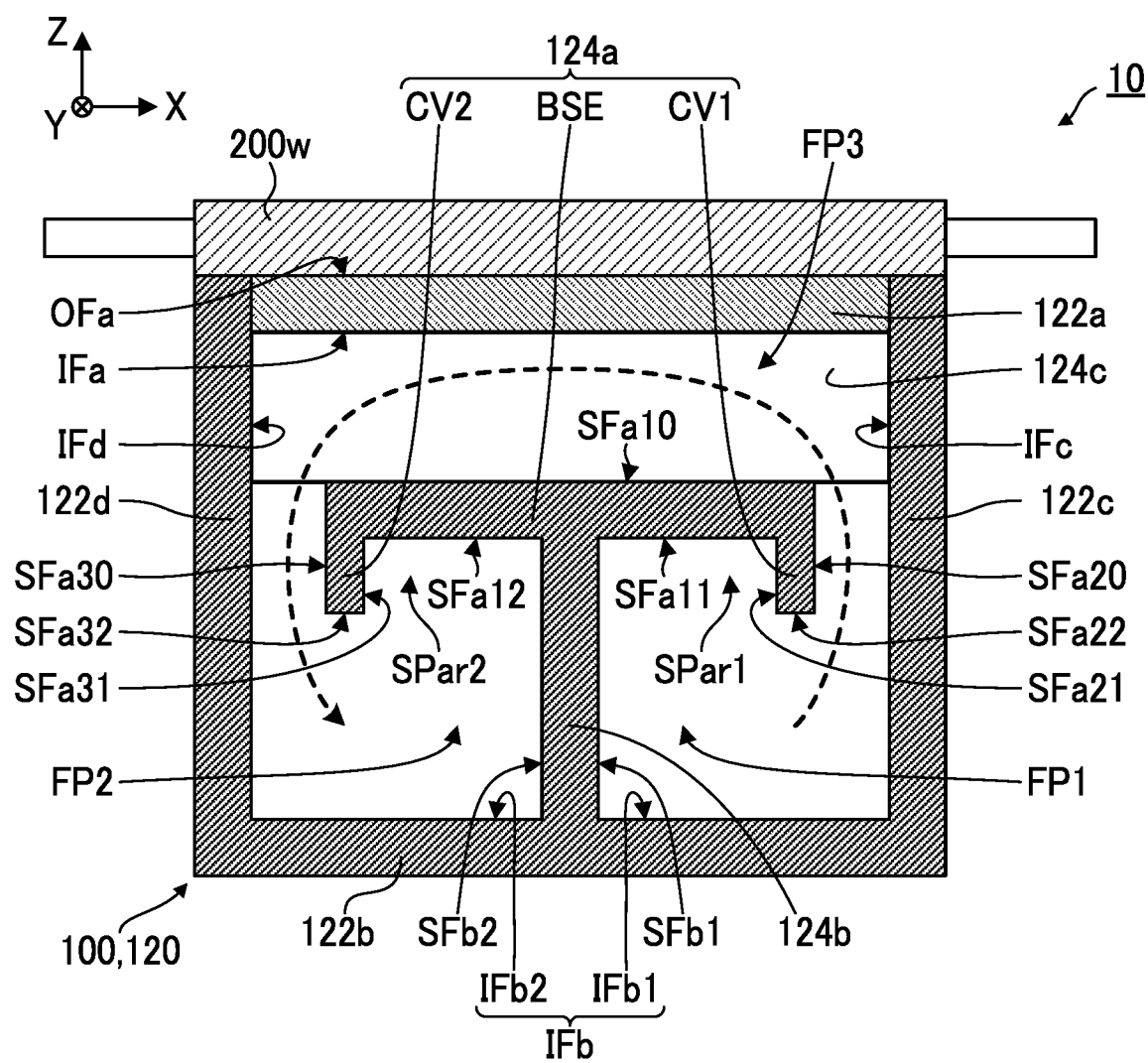
FIG. 3 is a diagram explaining a body shown in FIG. 1.

FIG. 3 is a diagram explaining the body 120 shown in FIG. 1. FIG. 3 is a cross section of the power converter 10 taken along line B1-B2 shown in the first plan view of FIG. 2. A dashed arrow in FIG. 3 indicates flow of refrigerant. In the cross section of the semiconductor module 200, elements such as the switching element in the semiconductor module 200 are omitted. In the cross section of the semiconductor module 200 shown in the drawings following FIG. 3, elements such as the switching element in the semiconductor module 200 are omitted.

The body 120 includes the partitions 124a and 124b, in addition to the outer walls 122a, 122b, 122c, 122d, and 122e and the partition 124c described with reference to FIG. 1. The partition 124a is an example of a "partition."

The partition 124a is arranged between the outer walls 122a and 122b. In other words, the partition 124a is spaced apart from the outer wall 122a in the −Z direction. The partition 124a, which is arranged between the outer walls 122a and 122b, separates the inflow path FP1 and the plurality of cooling paths FP3 from each other, and separates the outflow path FP2 and the plurality of cooling paths FP3 from each other. A space, which causes the inflow path FP1 and the plurality of cooling paths FP3 to communicate with each other, is provided between an edge of the partition 124a in the +X direction and an inner surface IFc of the outer wall 122c. Similarly, a space, which causes the outflow path FP2 and the plurality of cooling paths FP3 to communicate with each other, is provided between an edge of the partition 124a in the −X direction and an inner surface IFd of the outer wall 122d.

The partition 124a includes, for example, a base BSE substantially parallel to the outer wall 122a, a protrusion CV1 protruding in the −Z direction from an edge of the base BSE in the +X direction, and a protrusion CV2 protruding in the −Z direction from an edge of the base BSE in the −X direction. The protrusion CV1 is an example of a "protrusion," whereas the −Z direction is an example of a "direction away from the cooling wall." For example, the protrusion CV1 protrudes in the −Z direction away from the outer wall 122a from an edge closer to the inflow path FP1 among the two edges of the partition 124a along the Y direction. For example, the protrusion CV2 protrudes in the −Z direction away from the outer wall 122a from an edge closer to the outflow path FP2 among the two edges of the partition 124a along the Y direction.

The base BSE includes a surface SFa10, which faces the inner surface IFa of the outer wall 122a, and surfaces SFa11 and SFa12 opposite to the surface SFa10, for example. The surface SFa11 of the base BSE, which is a portion of a surface opposite to the surface SFa10, is positioned in the +X direction from a partition 124b, described below, whereas the surface SFa12 of the base BSE, which is a portion of the surface opposite to the surface SFa10, is positioned in the −X direction from the partition 124b. In the embodiment, it is assumed that the surface SFa10 of the base BSE is substantially parallel to the inner surface IFa of the outer wall 122a; however, the surface SFa10 of the base BSE may not be parallel to the inner surface IFa of the outer wall 122a. For example, the surface SFa10 of the base BSE may be tilted such that an edge of the surface SFa10 in the +X direction is farther from the outer wall 122a than any other portion of the surface SFa10.

The protrusion CV1 includes a surface SFa20 facing the inner surface IFc of the outer wall 122c, a surface SFa21 opposite to the surface SFa20, and a surface SFa22 included in an end portion of the protrusion CV1. The protrusion CV2 includes a surface SFa30 facing the inner surface IFd of the outer wall 122d, a surface SFa31 opposite to the surface SFa30, and a surface SFa32 included in an end portion of the protrusion CV2. In the embodiment, it is assumed that the protrusions CV1 and CV2 are substantially parallel to the Y-Z plane; however, the protrusions CV1 and CV2 may not be parallel to the Y-Z plane.

In the following description, the surfaces SFa10, SFa11, and SFa12 of the base BSE may be referred to as the surfaces SFa10, SFa11, and SFa12 of the partition 124a, respectively. The surfaces SFa20, SFa21, and SFa22 of the protrusion CV1 may be referred to as the surfaces SFa20, SFa21, and SFa22 of the partition 124a, respectively. The surfaces SFa30, SFa31, and SFa32 of the protrusion CV2 may be referred to as the surfaces SFa30, SFa31, and SFa32 of the partition 124a, respectively.

The partition 124b, which is arranged between the outer walls 122c and 122d, is connected to the partition 124a and the outer wall 122b. The partition 124b, which is a wall substantially parallel to the Y-Z plane, separates the inflow path FP1 and the outflow path FP2 from each other, for example. For example, a surface SFb1 of the partition 124b, which faces the inner surface IFc of the outer wall 122c, is substantially parallel to the inner surface IFc of the outer wall 122c. The surface SFb2 of the partition 124b, which faces the inner surface IFd of the outer wall 122d, is substantially parallel to the inner surface IFd of the outer wall 122d.

For example, the surfaces SFa11, SFa21, and SFa22 of the partition 124a, the surface SFb1 of the partition 124b, and an inner surface IFb1 of the outer wall 122b constitute a part of a wall surface of the inflow path FP1. The surfaces SFa12, SFa31, and SFa32 of the partition 124a, the surface SFb2 of the partition 124b, and an inner surface IFb2 of the outer wall 122b constitute a part of a wall surface of the outflow path FP2. The inner surface IFb1 of the outer wall 122b, which is a portion of the inner surface IFb of the outer wall 122b, is positioned in the +X direction from the partition 124b, whereas the inner surface IFb2 of the outer wall 122b, which is a portion of the inner surface IFb of the outer wall 122b, is positioned in the −X direction from the partition 124b.

The refrigerant, which has flowed into the inflow path FP1, passes between the surface SFa20 of the protrusion CV1 and the inner surface IFc of the outer wall 122c, and then flows into the plurality of cooling paths FP3. The refrigerant, which has flowed into the plurality of cooling paths FP3, passes between the surface SFa30 of the protrusion CV2 and the inner surface IFd of the outer wall 122d, and then flows into the outflow path FP2. In other words, in the embodiment, one end of each of the plurality of cooling paths FP3 communicates with the inflow path FP1, whereas the other end of each of the plurality of cooling paths FP3 communicates with the outflow path FP2.

The partition 124c, which is a wall substantially perpendicular to the outer wall 122a, extends in the X direction. For example, the partition 124c is arranged between the partition 124a and the outer wall 122a, and the partition 124c is connected to the outer walls 122a, 122c, and 122d, and the partition 124a. In other words, in the embodiment, the partition 124c is connected to both the partition 124a and the outer wall 122a. Alternatively, the partition 124c may be connected to only one of the partition 124a and the outer wall 122a. Each of the plurality of cooling paths FP3 is formed, for example, between two adjacent partitions 124c among the plurality of partitions 124c. The inner surface IFa of the outer wall 122a and the surface SFa10 of the partition 124a constitute a part of the wall surfaces of the plurality of cooling paths FP3.

In the embodiment, the outer wall 122a includes the inner surface IFa that constitutes a part of the wall surfaces of the plurality of cooling paths FP3, and the semiconductor module 200 is arranged on the outer surface OFa of the outer wall 122a. Thus, for example, heat generated in the semiconductor module 200 is conducted to the refrigerant in the plurality of cooling paths FP3 from a surface of the semiconductor module 200 that faces the outer surface OFa of the outer wall 122a. The semiconductor module 200 is cooled by so-called one-side cooling. Although not particularly shown in FIG. 3, a thermal interface material (TIM), such as a thermally conductive grease, a thermally conductive adhesive, a thermally conductive sheet, and solder, may be interposed between the semiconductor module 200 and the outer surface OFa of the outer wall 122a.

In the embodiment, the partition 124a includes the surfaces SFa11, SFa21, and SFa22 that constitute a part of the wall surface of the inflow path FP1. Among the surfaces SFa11, SFa21, and SFa22 that constitute the part of the wall surface of the inflow path FP1, the surface SFa11 on which the protrusion CV1 is not formed and the surface SFa22 included in the end portion of the protrusion CV1 are different from each other in position in the Z direction, for example. A surface that includes the surfaces SFa11, SFa21, and SFa22 is an example of a "third surface." In other words, in the embodiment, the partition 124a is formed so that the third surface (surface including the surfaces SFa11, SFa21, and SFa22), which constitutes a part of the wall surface of the inflow path FP1, includes a first portion and a second portion of which positions in the Z direction are different from each other. In the embodiment, the end portion of the protrusion CV1 corresponds to the first portion, whereas a portion (surface SFa11), on which the protrusion CV1 is not formed, among the surfaces SFa11, SFa21, and SFa22 corresponds to the second portion.

The inflow path FP1 includes a gas retaining space SPar1 defined by the end portion of the protrusion CV1 and the surface SFa11 of the base BSE. For example, the surface SFa11 of the base BSE and the surface SFa21 of the protrusion CV1 among the surfaces of the partition 124a constitute a part of a wall surface of the gas retaining space SPar1. In other words, in the partition 124a, the gas retaining space SPar1 is a space that is recessed in the +Z direction from the surface SFa22 of the protrusion CV1. The gas retaining space SPar1 is an example of a "first gas retaining space."

Although functions of the gas retaining space SPar1 will be described below with reference to FIG. 5, for example, in the embodiment, the gas retaining space SPar1 retains gas AR produced or entering in the inflow path FP1 due to boiling of the refrigerant or the like, thereby resulting in substantially preventing movement of the gas AR to the plurality of cooling paths FP3. Therefore, in the embodiment, it is possible to lessen the decrease in the cooling efficiency of the cooler 100.

In the embodiment, the partition 124a includes the surfaces SFa12, SFa31, and SFa32 that constitute a part of the wall surface of the outflow path FP2. Among the surfaces SFa12, SFa31, and SFa32 that constitute the part of the wall surface of the outflow path FP2, the surface SFa12 on which the protrusion CV2 is not formed and the surface SFa32 included in the end portion of the protrusion CV2 are different from each other in position in the Z direction, for example. A surface that include the surfaces SFa12, SFa31, and SFa32 is an example of a "fourth surface." In other words, in the embodiment, the partition 124a is formed so that the fourth surface (surface including the surfaces SFa12, SFa31, and SFa32), which constitutes a part of the wall surface of the outflow path FP2, includes a third portion and a fourth portion of which positions in the Z direction are different from each other. In the embodiment, the end portion of the protrusion CV2 corresponds to the third portion, whereas a portion (surface SFa12), on which the protrusion CV2 is not formed, among the surfaces SFa12, SFa31, and SFa32 corresponds to the fourth portion.

The outflow path FP2 includes a gas retaining space SPar2 defined by the end portion of the protrusion CV2 and the surface SFa12 of the base BSE. For example, the surface SFa12 of the base BSE and the surface SFa31 of the protrusion CV2 among the surfaces of the partition 124a constitute a part of a wall surface of the gas retaining space SPar2. In other words, in the partition 124a, the gas retaining space SPar2 is a space that is recessed in the +Z direction from the surface SFa32 of the protrusion CV2. The gas retaining space SPar2 is an example of a "second gas retaining space." The protrusions CV1 and CV2 are formed in the embodiment; consequently, the partition 124a is U-shaped in plan view from the −Y direction.

Furthermore, in the embodiment, the plurality of cooling paths FP3 is arranged in the Z direction not only between the inflow path FP1 and the outer wall 122a, but also between the outflow path FP2 and the outer wall 122a; consequently, it is possible to provide a space in the Z direction from the terminals (for example, the input terminals 202 and 204, and an output terminal 206, etc.) of the semiconductor module 200. For example, the inflow path FP1 and the outflow path FP2 are positioned in the −Z direction from the partitions 124c that separates the cooling paths FP3 from each other. Thus, in the embodiment, the inner surface IFc of the outer wall 122c, which defines one end of each of the plurality of cooling paths FP3, can constitute a part of the wall surface of the inflow path FP1, whereas the inner surface IFd of the outer wall 122d, which defines the other end of each of the plurality of cooling paths FP3, can constitute a part of the wall surface of the outflow path FP2. In this case, a space is provided in the Z direction from the terminals of the semiconductor module 200; therefore, wires, etc., can be easily connected to the terminals of the semiconductor module 200.

The shape of the partition 124a is not limited to the example shown in FIG. 3. For example, only the protrusion CV1 among the protrusions CV1 and CV2 may be formed. In this case, the partition 124a is L-shaped in plan view from the −Y direction.

FIG. 4 is another diagram explaining the body 120 shown in FIG. 1. A plan view in FIG. 4 is a plan view of the cooler 100 as viewed from the −Z direction. A C1-C2 cross section in FIG. 4 is a cross section of the cooler 100 taken along line C1-C2 in the plan view in FIG. 4, whereas a D1-D2 cross section in FIG. 4 is a cross section of the cooler 100 taken along line D1-D2 in the plan view in FIG. 4. Dashed arrows in FIG. 4 each indicate flow of refrigerant.

The refrigerant, which has flowed from the supply pipe 160 into the inflow path FP1, flows into the plurality of cooling paths FP3. Then, heat exchange is performed between the refrigerant flowing into the plurality of cooling paths FP3 and the semiconductor module 200. The refrigerant, which has flowed into the plurality of cooling paths FP3, flows into the outflow path FP2. The refrigerant, which has flowed into the outflow path FP2, is drained from the drain pipe 162. As described above, in the embodiment, the semiconductor module 200 can be cooled by fresh refrigerant flowing from the inflow path FP1 into the plurality of cooling paths FP3. The fresh refrigerant is, for example, a refrigerant before heat exchange with the semiconductor module 200, or a refrigerant having a temperature substantially equal to that of the refrigerant before heat exchange with the semiconductor module 200.

In the embodiment, the plurality of partitions 124c is formed integrally with the outer wall 122a, as shown in the C1-C2 cross section and the D1-D2 cross section. A contact area between the refrigerant and a structure, in which the outer wall 122a and the plurality of partitions 124c are formed integrally with each other, is greater than a contact area between the refrigerant and an outer wall 122a, which is not connected to the plurality of partitions 124c, for example. Therefore, in the embodiment, the heat transfer efficiency can be improved in a case in which heat is transferred from the semiconductor module 200 to the refrigerant via the outer wall 122a.

In FIG. 4, a portion of the outer wall 122e integrally formed with the outer wall 122a may be referred to as an outer wall 122ea, whereas a portion of the outer wall 122e other than the outer wall 122ea may be referred to as an outer wall 122eb.

The method of manufacturing the plurality of partitions 124c, etc., is not particularly limited. For example, the plurality of partitions 124c formed integrally with the outer wall 122a may or may not be connected to the partition 124a. Alternatively, the plurality of partitions 124c may not be formed integrally with the outer wall 122a, for example. In this case, the plurality of partitions 124c may be formed integrally with the partition 124a. The plurality of partitions 124c formed integrally with the partition 124a may or may not be connected to the outer wall 122a. Alternatively, a plurality of partitions 124c formed separately from both the outer wall 122a and the partition 124a may be connected to one or both of the outer wall 122a and the partition 124a.

Next, the functions of the gas retaining space SPar1 will be described with reference to FIG. 5.

Figure 5:
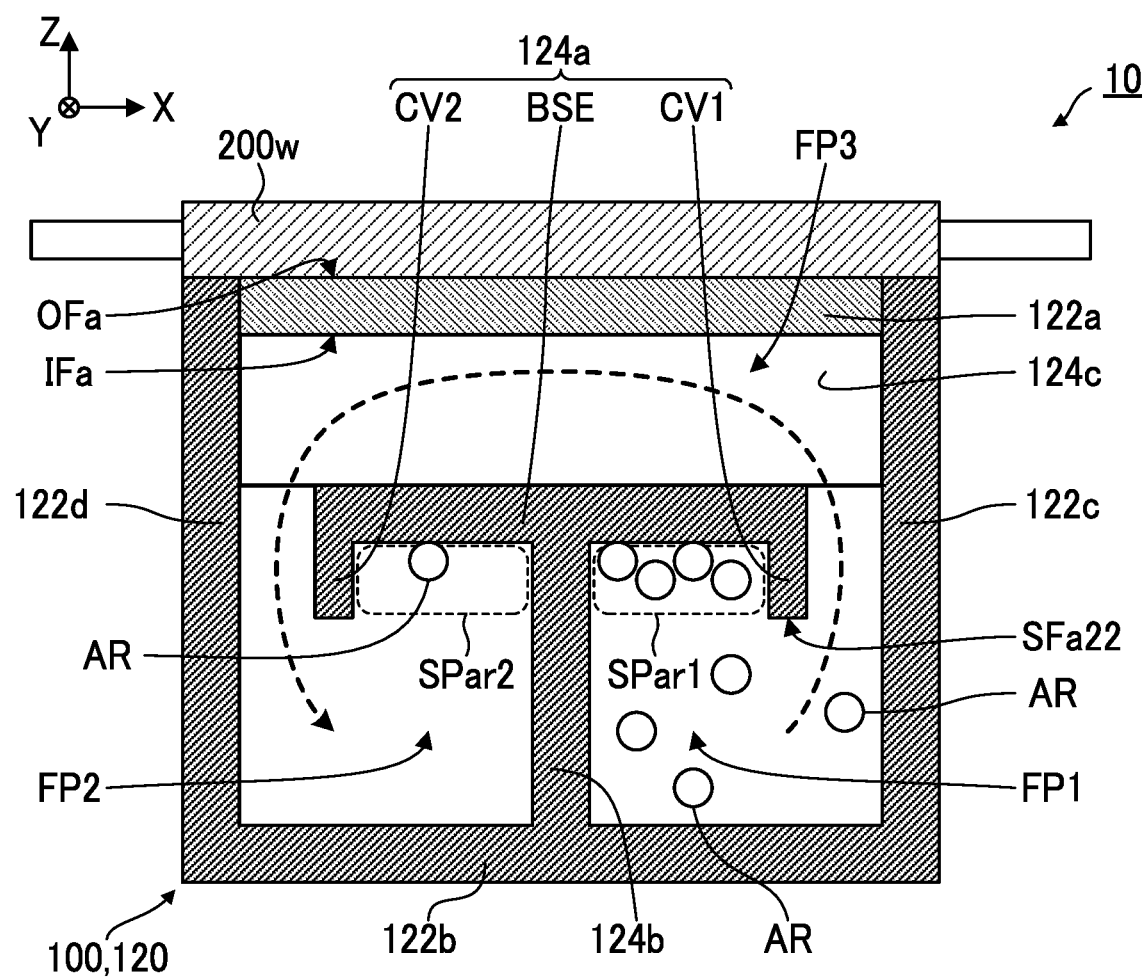
FIG. 5 is a diagram explaining functions of a cooler shown in FIG. 1.

FIG. 5 is a diagram explaining the functions of the cooler 100 shown in FIG. 1. In FIG. 5, it is assumed that gas AR is produced or enters in the inflow path FP1 due to boiling of the refrigerant, etc.

As described with reference to FIG. 3, in the partition 124a, the gas retaining space SPar1 is a space that is recessed in the +Z direction from the surface SFa22 of the protrusion CV1. In the embodiment, the +Z direction corresponds to an upward direction in the gravity direction. Thus, the gas AR in the inflow path FP1 rises in the +Z direction (upward direction in the gravity direction) to move into the gas retaining space SPar1, for example. In the embodiment, for example, the protrusion CV1 functions as an obstacle to the gas AR moving from the gas retaining space SPar1 to the plurality of cooling paths FP3; consequently, the gas AR having moved into the gas retaining space SPar1 remains in the gas retaining space SPar1. In other words, in the embodiment, it is possible to substantially prevent the gas AR from moving to the plurality of cooling paths FP3. As a result, in the embodiment, it is possible to substantially prevent the gas AR from remaining in the plurality of cooling paths FP3 in a state in which the gas AR is in contact with the inner surface IFa of the outer wall 122a. Therefore, in the embodiment, it is possible to lessen the decrease in the cooling efficiency of the cooler 100.

Furthermore, when gas AR is produced or enters in the outflow path FP2, the gas AR in the outflow path FP2 rises in the +Z direction to remain in the gas retaining space Spar2, for example. In other words, in the embodiment, it is possible to substantially prevent the gas AR in the outflow path FP2 from moving to the plurality of cooling paths FP3. As a result, in the embodiment, it is possible to substantially prevent the gas AR from remaining in the plurality of cooling paths FP3 in a state in which the gas AR is in contact with the inner surface IFa of the outer wall 122a. Therefore, in the embodiment, it is possible to lessen the decrease in the cooling efficiency of the cooler 100.

As a configuration to be compared with the power converter 10, a configuration (first comparative example) in which the protrusions CV1 and CV2 are omitted from the partition 124a will be described with reference to FIG. 6.

Figure 6:
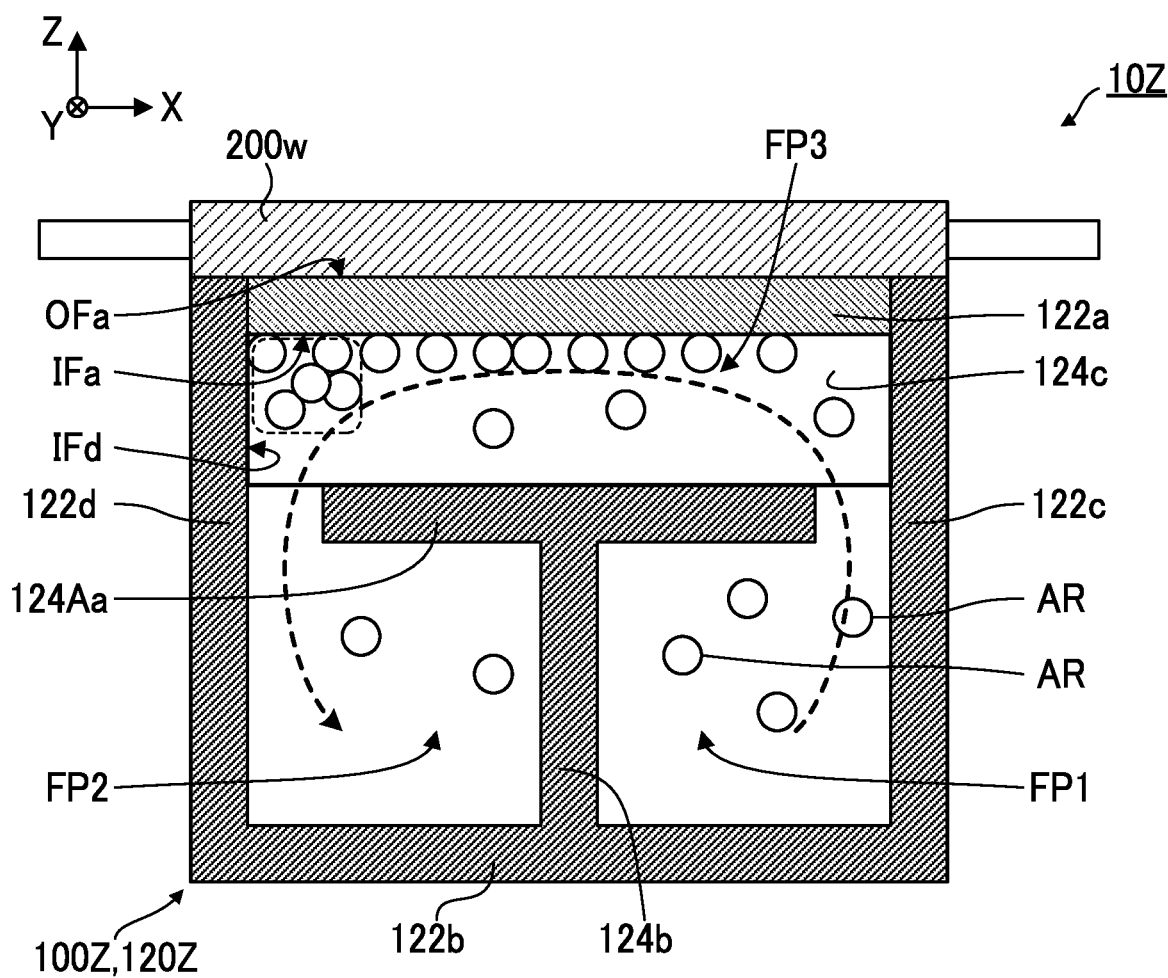
FIG. 6 is a diagram explaining an example of a power converter according to a first comparative example.

FIG. 6 is a diagram explaining an example of a power converter 10Z according to the first comparative example. FIG. 6 is a cross section of the power converter 10Z corresponding to the cross section of the power converter 10 shown in FIG. 3. Elements substantially the same as the elements described with reference to FIG. 1 to FIG. 5 are denoted with like reference signs, and detailed explanations thereof are omitted. A dashed arrow in FIG. 6 indicates flow of refrigerant.

The power converter 10Z is similar to the power converter 10 shown in FIG. 1 and other drawings, except for including a cooler 100Z instead of the cooler 100 shown in FIG. 1 and other drawings. The cooler 100Z is similar to the cooler 100 shown in FIG. 1 and other drawings, except for including a body 120Z instead of the body 120 shown in FIG. 1 and other drawings. The body 120Z is similar to the body 120 except for including a partition 124Aa instead of the partition 124a shown in FIG. 3. The partition 124Aa is similar to the partition 124a, except that the protrusions CV1 and CV2 are omitted. In other words, the inflow path FP1 of the cooler 100Z does not include the gas retaining space SPar1. Similarly, the outflow path FP2 of the cooler 100Z does not include the gas retaining space SPar2.

Consequently, gas AR, which has been produced or has entered in the inflow path FP1 by boiling of the refrigerant, etc., rises in the +Z direction to move into the plurality of cooling paths FP3 without remaining the inflow path FP1, for example. The gas AR in the plurality of cooling paths FP3 rises in the +Z direction. The refrigerant in the plurality of cooling paths FP3 flows in the −X direction (direction toward the inner surface IFd of the outer wall 122d); consequently, the gas AR in the plurality of cooling paths FP3 moves toward the inner surface IFd of the outer wall 122d.

In the cooler 100Z, the inner surface IFa of the outer wall 122a, which constitutes a part of the wall surfaces of the plurality of cooling paths FP3, is perpendicular to the inner surface IFd of the outer wall 122d, which constitutes a part of the wall surface of the outflow path FP2. Thus, in the cooler 100Z, the flow of the gas AR, etc., weakens at a corner portion (for example, an area surrounded by a dashed line in FIG. 6) near a point at which the inner surface IFa and the inner surface IFd intersect. Consequently, the gas AR, which has moved from the inflow path FP1 into the plurality of cooling paths FP3, remains at the corner portion near the point at which the inner surface IFa and the inner surface IFd intersect, for example. As a result, the gas AR, which has moved from the inflow path FP1 into the plurality of cooling paths FP3, remains in the plurality of cooling paths FP3 in a state in which the gas AR is in contact with the inner surface IFa of the outer wall 122a, for example. In this case, the cooling efficiency is reduced when the semiconductor module 200 arranged on the outer surface OFa of the outer wall 122a is cooled.

For example, a configuration (second comparative example) is assumed in which, among the plurality of cooling paths FP3, a rear cooling path FP3 closest to the outer wall 122e is used to retain gas AR. In the second comparative example, gas AR remains in the rear cooling path FP3 by inclining the cooler 100Z so that the rear cooling path FP3 is positioned in the +Z direction apart from a cooling path FP3 that is far from the outer wall 122e among the plurality of cooling paths FP3. Thus, in the second comparative example, by arranging the semiconductor module 200 on a portion of the outer surface OFa of the outer wall 122a not overlapping the rear cooling path FP3 in plan view from the +Z direction, a decrease in the cooling efficiency in cooling the semiconductor module 200 is reduced. However, in the second comparative example, the cooler 100Z needs to be inclined; consequently, the power converter 10Z including the cooler 100Z is larger in the Z direction. Furthermore, the rear cooling path FP3 that is not used to cool the semiconductor module 200 is provided; consequently, the cooler 100Z is larger in the Y direction.

In contrast thereto, in the embodiment, it is possible to substantially prevent the gas AR, which has been produced or has entered in the inflow path FP1, from moving to the plurality of cooling paths FP3, without tilting the cooler 100. Furthermore, in the embodiment, it is not necessary to arrange a cooling path FP3 that is not used to cool the semiconductor module 200; therefore, it is possible to substantially prevent an increase in the size of the cooler 100 in the Y direction.

A schematic internal structure of the entire power converter 10 will be described with reference to FIG. 7.

Figure 7:
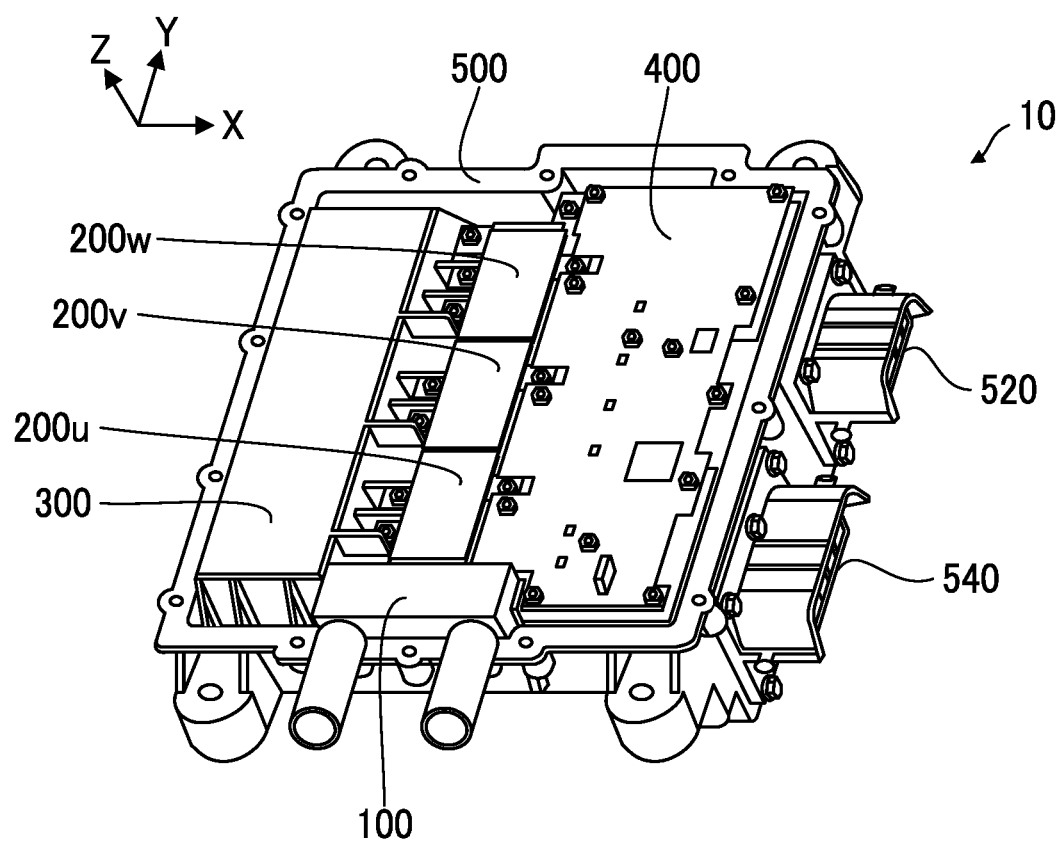
FIG. 7 is a perspective view showing an example of a schematic internal structure of the entire power converter.

FIG. 7 is a perspective view showing an example of the schematic internal structure of the entire power converter 10.

The power converter 10 includes a capacitor 300, a control board 400, a housing 500, an input connector 520, and an output connector 540, etc., in addition to the cooler 100 and the semiconductor module 200 shown in FIG. 1 and other drawings. The capacitor 300 smooths a DC voltage applied between the input terminals 202 and 204 of the semiconductor module 200. The control board 400 is provided with a control circuit configured to control the semiconductor module 200. The housing 500 houses internal components of the power converter 10, such as the cooler 100, the semiconductor module 200, the capacitor 300, and the control board 400. The housing 500 is provided with the input connector 520 and the output connector 540. For example, a DC voltage is applied between the input terminals 202 and 204 of the semiconductor module 200 from a DC power source (not shown) via the input connector 520. Furthermore, for example, three-phase AC power having a U-phase, a V-phase, and a W-phase is output from the output terminal 206 of the semiconductor module 200 to an external device (for example, a motor) not shown, via the output connector 540.

The configuration of the power converter 10 is not limited to the example shown in FIG. 7. In the embodiment, for example, the semiconductor module 200 is cooled from one side of the semiconductor module 200; consequently, the cooler 100 can be reduced in size in the Z direction. Therefore, in the embodiment, a space is provided which is used to arrange other members, etc., in the +Z direction from the semiconductor module 200. The control board 400 may be arranged such that the control board 400 partially overlaps the semiconductor module 200 in plan view from the +Z direction, for example. In this case, the power converter 10 can be reduced in size in the X direction while substantially preventing an increase in the size of the power converter 10 in the Z direction.

As described above, in the embodiment, the power converter 10 includes the cooler 100. The cooler 100 includes the body 120 extending in the Y direction. The body 120 includes the outer wall 122a that includes the outer surface OFa, on which the semiconductor module 200 is arranged, and the inner surface IFa opposite to the outer surface OFa. Furthermore, the body 120 includes: the inflow path FP1 extending in the Y direction and having one end from which the refrigerant flows into the inflow path FP1; the outflow path FP2 extending in the Y direction and having one end from which the refrigerant is drained; the plurality of cooling paths FP3 each having the wall surface, a part of the wall surface being constituted by the inner surface IFa; and the partition 124a. The partition 124a is spaced apart from the outer wall 122a in the Z direction perpendicular to the outer surface OFa. The partition 124a separates the inflow path FP1 and the plurality of cooling paths FP3 from each other. The partition 124a separates the outflow path FP2 and the plurality of cooling paths FP3 from each other. The plurality of cooling paths FP3 is arrayed in the Y direction. Each of the plurality of cooling paths FP3 extends in the X direction that intersects the Y direction.

Each of the plurality of cooling paths FP3 is positioned between the inflow path FP1 and the outer wall 122a in the Z direction. Each of the plurality of cooling paths FP3 is positioned between the outflow path FP2 and the outer wall 122a in the Z direction. Each of the plurality of cooling paths FP3 causes the inflow path FP1 and the outflow path FP2 to communicate with each other in the X direction. The partition 124a includes the third surface (surface including the surfaces SFa11, SFa21, and SFa22) which constitutes a part of the wall surface of the inflow path FP1. The third surface includes the first portion and the second portion of which positions in the Z direction are different from each other. The inflow path FP1 includes the gas retaining space SPar1 defined by the first portion and the second portion.

In the embodiment, the inflow path FP1 includes the gas retaining space SPar1; consequently, even when gas AR is produced or enters in the inflow path FP1, the gas AR can remain in the gas retaining space SPar1. Thus, in the embodiment, it is possible to substantially prevent the gas AR in the inflow path FP1 from moving to the plurality of cooling paths FP3. In other words, in the embodiment, it is possible to substantially prevent the gas AR from remaining in the plurality of cooling paths FP3 in a state in which the gas AR is in contact with the inner surface IFa of the outer wall 122a. Therefore, in the embodiment, it is possible to lessen the decrease in the cooling efficiency of the cooler 100.

In the embodiment, the partition 124a includes the protrusion CV1 and the two edges along the Y direction. The protrusion CV1 protrudes in the direction (−Z direction) away from the outer wall 122a from the edge that is closest to the inflow path FP1 among the two edges. The first portion is the end portion of the protrusion CV1, whereas the second portion is a portion (the surface SFa11 of the base BSE) of the third surface (surface including the surfaces SFa11, SFa21, and SFa22) on which the protrusion CV1 is not present. Consequently, in the embodiment, the inflow path FP1 includes the gas retaining space SPar1 defined by the end portion of the protrusion CV1 and the surface SFa11 of the base BSE. Thus, in the embodiment, as described above, it is possible to substantially prevent the gas AR from remaining in the plurality of cooling paths FP3 in a state in which the gas AR is in contact with the inner surface IFa of the outer wall 122a, thereby resulting in lessening a decrease in the cooling efficiency of the cooler 100.

In the embodiment, the partition 124a includes the fourth surface (surface including the surfaces SFa12, SFa31, and SFa32) that constitutes a part of the wall surface of the outflow path FP2. The fourth surface includes the third portion and the fourth portion of which positions in the Z direction are different from each other. The outflow path FP2 includes the gas retaining space SPar2 defined by the third portion and the fourth portion. The third portion is the end portion of the protrusion CV2, whereas the fourth portion is a portion (the surface SFa12 of the base BSE) of the fourth surface (surface including the surfaces SFa12, SFa31, and SFa32) on which the protrusion CV2 is not present.

As described above, in the embodiment, the outflow path FP2 includes the gas retaining space SPar2; consequently, gas AR in the outflow path FP2 remains in the gas retaining space SPar2. Thus, in the embodiment, it is possible to substantially prevent the gas AR in the outflow path FP2 from moving to the plurality of cooling paths FP3. Therefore, in the embodiment, it is possible to substantially prevent the gas AR from remaining in the plurality of cooling paths FP3 in a state in which the gas AR is in contact with the inner surface IFa of the outer wall 122a, thereby resulting in lessening the decrease in the cooling efficiency of the cooler 100.

A2: Second Embodiment

Figure 8:
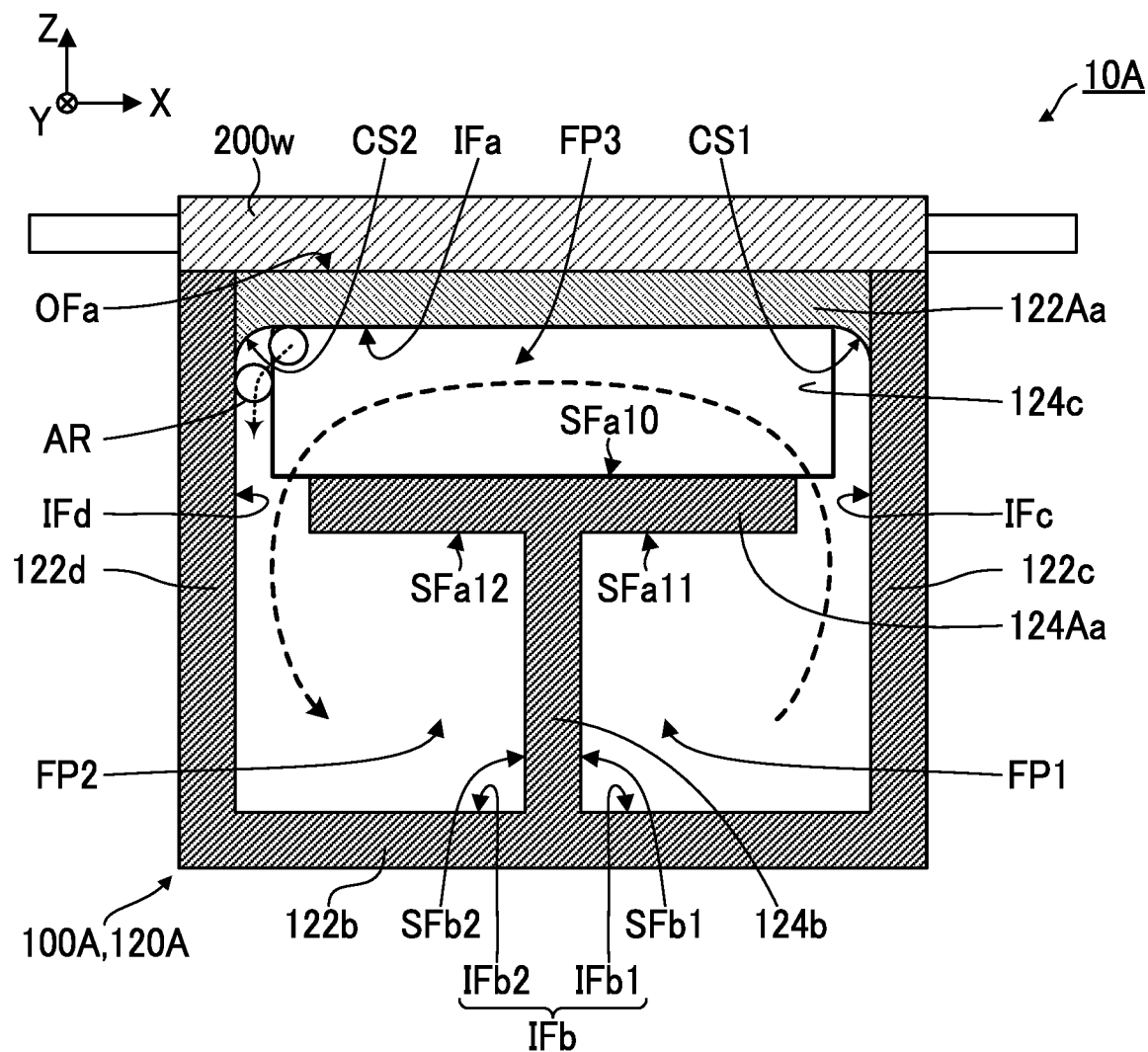
FIG. 8 is a diagram explaining an example of a power converter according to a second embodiment.

FIG. 8 is a diagram explaining an example of a power converter 10A according to a second embodiment. FIG. 8 is a cross section of the power converter 10A corresponding to the cross section of the power converter 10 shown in FIG. 3. Elements substantially the same as the elements described with reference to FIG. 1 to FIG. 7 are denoted with like reference signs, and detailed explanations thereof are omitted. A dashed arrow in FIG. 8 indicates flow of gas AR and flow of refrigerant.

The power converter 10A is similar to the power converter 10 shown in FIG. 1 and other drawings, except for including a cooler 100A instead of the cooler 100 shown in FIG. 1 and other drawings. The cooler 100A is similar to the cooler 100 shown in FIG. 1 and other drawings, except for including a body 120A instead of the body 120 shown in FIG. 1 and other drawings. The power converter 10A is another example of the "semiconductor device," whereas the body 120A is another example of the "cooling body."

The body 120A includes an outer wall 122Aa and a partition 124Aa instead of the outer wall 122a and the partition 124a shown in FIG. 3, respectively. In the body 120A, the partition 124c is not connected to either the outer wall 122c or 122d. Other elements of the body 120A are the same as that of the body 120. The outer wall 122Aa is another example of the "cooling wall," whereas the partition 124Aa is another example of the "partition."

The outer wall 122Aa is similar to the outer wall 122a except for including curved surfaces CS1 and CS2. For example, an inner surface IFa of the outer wall 122Aa, which constitutes a part of the wall surfaces of the plurality of cooling paths FP3, includes, as the curved surface CS1, a portion that is connected to the inner surface IFc of the outer wall 122c that constitutes a part of the wall surface of the inflow path FP1. Furthermore, the inner surface IFa of the outer wall 122Aa, which constitutes the part of the wall surfaces of the plurality of cooling paths FP3, includes, as the curved surface CS2, a portion that is connected to the inner surface IFd of the outer wall 122d that constitutes a part of the wall surface of the outflow path FP2. In other words, in the embodiment, a peripheral portion of the inner surface IFa of the outer wall 122Aa, which is close to the inflow path FP1 in the X direction, is the curved surface CS1, whereas a peripheral portion of the inner surface IFa of the outer wall 122Aa, which is close to the outflow path FP2 in the X direction, is the curved surface CS2.

The partition 124Aa is similar to the partition 124a except that the protrusions CV1 and CV2 are omitted. Therefore, in the embodiment, the inflow path FP1 does not include the gas retaining space SPar1. Similarly, the outflow path FP2 does not include the gas retaining space SPar2.

However, in the embodiment, the inner surface IFa of the outer wall 122Aa includes the curved surface CS2 that is connected to the inner surface IFd of the outer wall 122d; consequently, it is possible to substantially prevent flow of gas AR from weakening around a point at which the inner surface IFa intersects the inner surface IFd. In other words, in the embodiment, it is possible to substantially prevent gas AR from remaining in the plurality of cooling paths FP3 in a state in which the gas AR is in contact with the inner surface IFa of the outer wall 122Aa. Therefore, in the embodiment, it is possible to lessen the decrease in the cooling efficiency of the cooler 100A.

In the embodiment, the inner surface IFa of the outer wall 122Aa includes the curved surface CS1 that is connected to the inner surface IFc of the outer wall 122c; consequently, it is possible to substantially prevent flow of gas AR from weakening around a point at which the inner surface IFa intersects the inner surface IFc. Therefore, in the embodiment, it is possible to substantially prevent the gas AR from remaining in the plurality of cooling paths FP3 in a state in which the gas AR is in contact with the inner surface IFa of the outer wall 122Aa, thereby resulting in lessening the decrease in the cooling efficiency of the cooler 100A.

In the embodiment, the partition 124c is connected to a portion of the inner surface IFa of the outer wall 122Aa on which the curved surfaces CS1 and CS2 are not present. In this case, it is not necessary to connect the partition 124c to the curved surfaces CS1 and CS2; therefore, the partition 124c can be easily formed.

Figure 9:
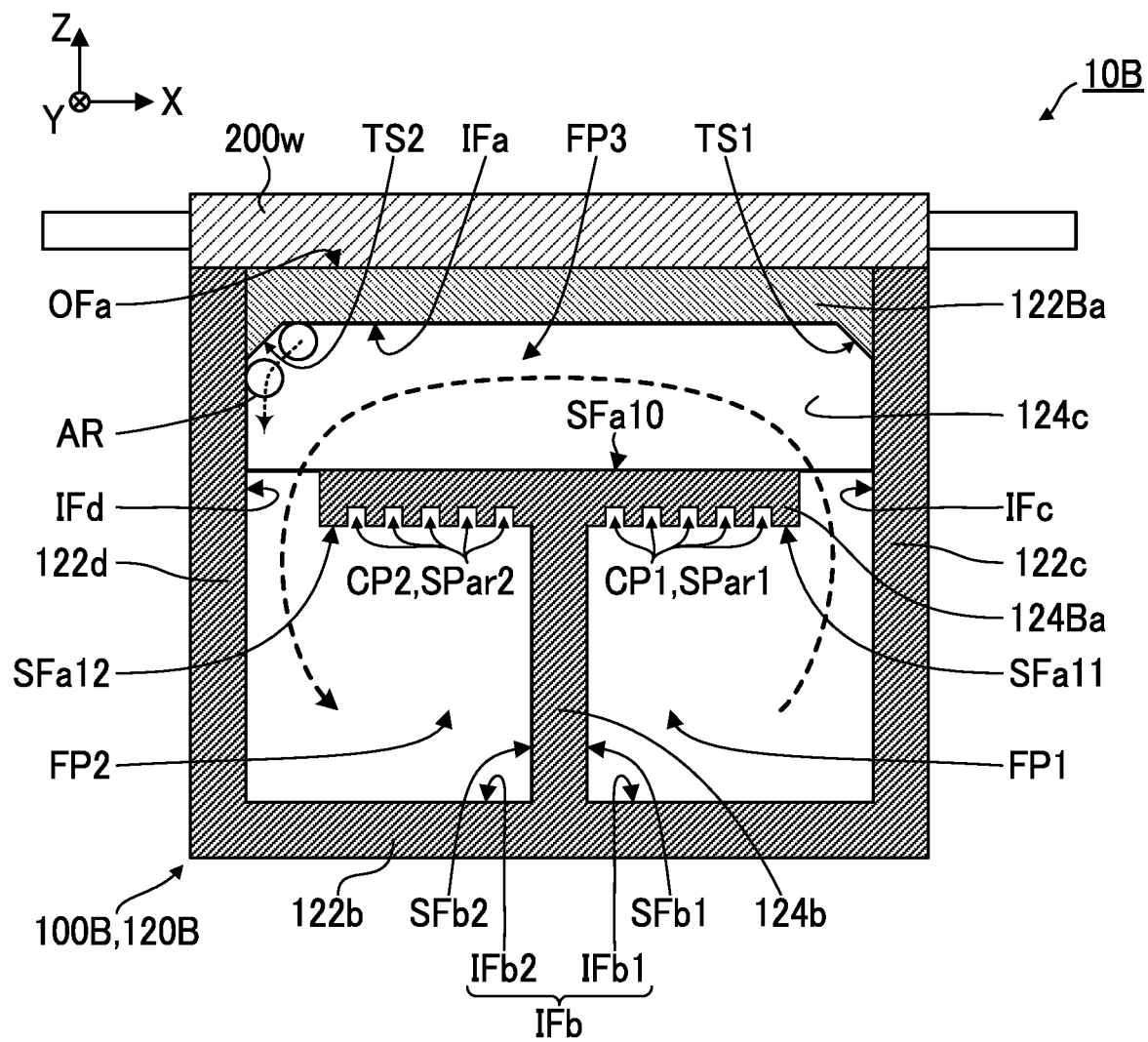
FIG. 9 is a diagram explaining an example of a power converter according to a third embodiment.

A configuration of the cooler 100A is not limited to the example shown in FIG. 8. For example, the outer wall 122Aa may include tilted surfaces TS1 and TS2 instead of the curved surfaces CS1 and CS2, as shown in FIG. 9. Even in this case, it is possible to substantially prevent flow of gas AR from weakening around a point at which the inner surface IFa intersects the inner surface IFc and around a point at which the inner surface IFa intersects the inner surface IFd.

The partition 124c may be connected to the curved surface CS1, the curved surface CS2, the outer wall 122c, and the outer wall 122d, for example. Alternatively, the outer wall 122Aa may be formed such that the inner surface IFa of the outer wall 122Aa intersects the inner surface IFc of the outer wall 122c at right angles (or substantially at right angles) without including the curved surface CS1, for example.

As described above, in the embodiment, the power converter 10A includes the cooler 100A. The cooler 100A includes the body 120A extending in the Y direction. The body 120A includes the outer wall 122Aa including the outer surface OFa on which the semiconductor module 200 is arranged, and the inner surface IFa opposite to the outer surface OFa. Furthermore, the body 120A includes: the inflow path FP1 extending in the Y direction and having one end from which the refrigerant flows into the inflow path FP1; the outflow path FP2 extending in the Y direction and having one end from which the refrigerant is drained; and the plurality of cooling paths FP3 each having the wall surface, a part of the wall surface being constituted by the inner surface IFa. The plurality of cooling paths FP3 is arrayed in the Y direction. Each of the plurality of cooling paths FP3 extends in the X direction that intersects the Y direction. Each of the plurality of cooling paths FP3 is positioned between the inflow path FP1 and the outer wall 122Aa in the Z direction. Each of the plurality of cooling paths FP3 is positioned between the outflow path FP2 and the outer wall 122Aa in the Z direction. Each of the plurality of cooling paths FP3 causes the inflow path FP1 and the outflow path FP2 to communicate with each other in the X direction.

The inner surface IFa of the outer wall 122Aa includes a peripheral portion close to the outflow path FP2 in the X direction. The peripheral portion close to the outflow path FP2 is the curved surface CS2. The peripheral portion close to the outflow path FP2 may be the tilted surface TS2 as shown in FIG. 9.

As described above, in the embodiment, the peripheral portion of the inner surface IFa of the outer wall 122Aa close to the outflow path FP2 in the X direction is the curved surface CS2 or the tilted surface TS2. Consequently, in the embodiment, it is possible to substantially prevent flow of gas AR from weakening around the peripheral portion of the inner surface IFa of the outer wall 122Aa close to the outflow path FP2 in the X direction. Thus, in the embodiment, it is possible to substantially prevent the gas AR from remaining in the plurality of cooling paths FP3 in a state in which gas AR is in contact with the inner surface IFa of the outer wall 122Aa. Therefore, in the embodiment, it is possible to lessen the decrease in the cooling efficiency of the cooler 100A.

In the embodiment, the inner surface IFa of the outer wall 122Aa includes a peripheral portion close to the inflow path FP1 in the X direction. The peripheral portion close to the inflow path FP1 is the curved surface CS1. The peripheral portion close to the outflow path FP2 may be the tilted surface TS1 as shown in FIG. 9. In other words, in the embodiment, the peripheral portion of the inner surface IFa of the outer wall 122Aa close to the inflow path FP1 in the X direction is the curved surface CS1 or the tilted surface TS1. Consequently, in the embodiment, it is possible to substantially prevent flow of gas AR from weakening around a point at which the inner surface IFa intersects the inner surface IFc, thereby resulting in substantially preventing gas AR from remaining in the plurality of cooling paths FP3 in a state in which gas AR is in contact with the inner surface IFa of the outer wall 122Aa. Therefore, in the embodiment, it is possible to lessen the decrease in the cooling efficiency of the cooler 100A.

A3: Third Embodiment

FIG. 9 is a diagram explaining an example of a power converter 10B according to a third embodiment. FIG. 9 is a cross section of the power converter 10B corresponding to the cross section of the power converter 10 shown in FIG. 3. Elements substantially the same as the elements described with reference to FIG. 1 to FIG. 8 are denoted with like reference signs, and detailed explanations thereof are omitted. A dashed arrow in FIG. 9 indicates flow of gas AR and flow of refrigerant.

The power converter 10B is similar to the power converter 10 shown in FIG. 1 and other drawings, except for including a cooler 100B instead of the cooler 100 shown in FIG. 1 and other drawings. The cooler 100B is similar to the cooler 100 shown in FIG. 1 and other drawings, except for including a body 120B instead of the body 120 shown in FIG. 1 and other drawings. The power converter 10B is yet another example of the "semiconductor device," whereas the body 120B is yet another example of the "cooling body."

The body 120B is similar to the body 120, except for including an outer wall 122Ba and a partition 124Ba instead of the outer wall 122a and the partition 124a shown in FIG. 3, respectively. The outer wall 122Ba is yet another example of the "cooling wall," whereas the partition 124Ba is another example of the "partition."

The outer wall 122Ba is similar to the outer wall 122a except for including the tilted surfaces TS1 and TS2. For example, an inner surface IFa of the outer wall 122Ba, which constitutes a part of the wall surfaces of the plurality of cooling paths FP3, includes, as the tilted surface TS1 that is tilted toward the inner surface IFc, a portion that is connected to the inner surface IFc of the outer wall 122c that constitutes a part of the wall surface of the inflow path FP1. The inner surface IFa of the outer wall 122Ba, which constitutes the part of the wall surfaces of the plurality of cooling paths FP3, includes, as the tilted surface TS2 that is tilted toward the inner surface IFd, a portion that is connected to the inner surface IFd of the outer wall 122d that constitutes a part of the wall surface of the outflow path FP2.

In other words, in the embodiment, a peripheral portion of the inner surface IFa of the outer wall 122Ba, which is close to the inflow path FP1 in the X direction, is the tilted surface TS1, whereas a peripheral portion of the inner surface IFa of the outer wall 122Ba, which is close to the outflow path FP2 in the X direction, is the tilted surface TS2. Therefore, it is possible to substantially prevent flow of gas AR from weakening not only around a point at which the inner surface IFa intersects the inner surface IFc, but also around a point at which the inner surface IFa intersects the inner surface IFd.

The partition 124Ba is similar to the partition 124a, except not only does it have a plurality of recesses CP1 instead of the protrusion CV1 shown in FIG. 3, but it also has a plurality of recesses CP2 instead of the protrusion CV2. For example, in the partition 124Ba, the plurality of recesses CP1 is formed on the surface SFa11, whereas the plurality of recesses CP2 is formed on the surface SFa12. The surface SFa11 is another example of the "third surface," whereas the surface SFa12 is another example of the "fourth surface." The plurality of recesses CP1 is an example of a "plurality of recesses."

Each of the plurality of recesses CP1 extends in the Y direction, and the plurality of recesses CP1 is arrayed in the X direction, for example. Alternatively, each of the plurality of recesses CP1 may extend in the X direction, and the plurality of recesses CP1 may be arrayed in the Y direction. Alternatively, a plurality of recesses CP1, each of which has a predetermined size, arrayed in the X and Y directions may be formed on the surface Sfa11.

Each of the plurality of recesses CP2 extends in the Y direction, and the plurality of recesses CP2 is arrayed in the X direction, for example. Alternatively, each of the plurality of recesses CP2 may extend in the X direction, and the plurality of recesses CP2 may be arrayed in the Y direction. Alternatively, a plurality of recesses CP2, each of which has a predetermined size, arrayed in the X and Y directions may be formed on the surface SFa12.

As described above, in the embodiment, the partition 124Ba is formed so that the surface SFa11, which constitutes a part of the wall surface of the inflow path FP1, includes the first portion and the second portion of which positions in the Z direction are different from each other, for example. In the embodiment, a bottom surface of each of the plurality of recesses CP1 corresponds to the first portion, whereas a top portion of each of a plurality of protrusions formed by the plurality of recesses CP1 (portion that is close to each of the recesses CP1) corresponds to the second portion. A space defined by the first portion and the second portion, in other words, a space in the recess CP1, corresponds to the gas retaining space SPar1. Thus, in the embodiment, the inflow path FP1 includes the gas retaining space SPar1, as in the first embodiment. Therefore, in the embodiment, it is possible to substantially prevent gas AR in the inflow path FP1 from moving to the plurality of cooling paths FP3.

In the embodiment, the partition 124Ba is formed so that the surface SFa12, which constitutes a part of the wall surface of the outflow path FP2, includes the third portion and the fourth portion of which positions in the Z direction are different from each other, for example. In the embodiment, a bottom surface of each of the plurality of recesses CP2 corresponds to the third portion, whereas a top portion of each of a plurality of protrusions formed by the plurality of recesses CP2 (portion that is close to each of the recesses CP2) correspond to the fourth portion. A space defined by the third portion and the fourth portion, in other words, a space in the recess CP2, corresponds to the gas retaining space SPar2. Thus, in the embodiment, the outflow path FP2 includes the gas retaining space SPar2, as in the first embodiment. Therefore, in the embodiment, it is possible to substantially prevent gas AR in the outflow path FP2 from moving to the plurality of cooling paths FP3.

A configuration of the cooler 100B is not limited to the example shown in FIG. 9. For example, the outer wall 122Ba may include the curved surfaces CS1 and CS2 shown in FIG. 8 instead of the tilted surfaces TS1 and TS2. The partition 124c may not be connected to either the tilted surface TS1, the tilted surface TS2, the outer wall 122c, or the outer wall 122d, as in the partition 124c shown in FIG. 8, for example.

The outer wall 122Ba may not include one or both of the tilted surfaces TS1 and TS2, for example. Specifically, the outer wall 122Ba may be formed such that the inner surface IFa of the outer wall 122Ba intersects the inner surface IFc of the outer wall 122c at right angles (or substantially at right angles) without including the tilted surface TS1. Alternatively, the outer wall 122Ba may be formed such that the inner surface IFa of the outer wall 122Ba intersects the inner surface IFd of the outer wall 122d at right angles (or substantially at right angles) without including the tilted surface TS2.

Alternatively, the cooler 100B may include the partition 124a instead of the partition 124Ba.

As described above, in the embodiment, it is possible to obtain effects similar to those in the first embodiment and the second embodiment described above.

A4: Fourth Embodiment

Figure 10:
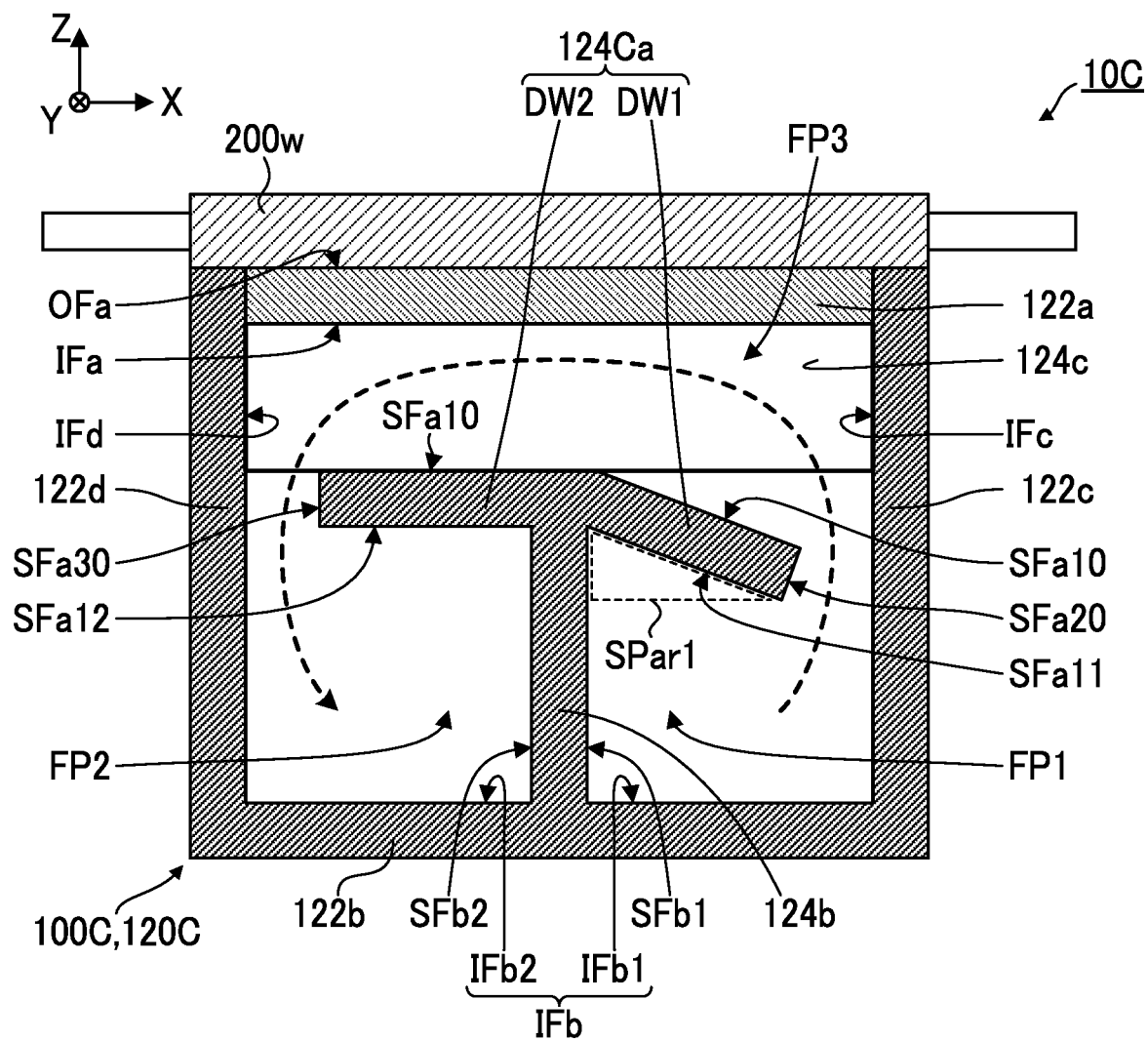
FIG. 10 is a diagram explaining an example of a power converter according to a fourth embodiment.

FIG. 10 is a diagram explaining an example of a power converter 10C according to a fourth embodiment. FIG. 10 is a cross section of the power converter 10C corresponding to the cross section of the power converter 10 shown in FIG. 3. Elements substantially the same as the elements described with reference to FIG. 1 to FIG. 9 are denoted with like reference signs, and detailed explanations thereof are omitted. A dashed arrow in FIG. 10 indicates flow of refrigerant.

The power converter 10C is similar to the power converter 10 shown in FIG. 1 and other drawings, except for including a cooler 100C instead of the cooler 100 shown in FIG. 1 and other drawings. The cooler 100C is similar to the cooler 100 shown in FIG. 1 and other drawings, except for including a body 120C instead of the body 120 shown in FIG. 1 and other drawings. The power converter 10C is yet another example of the "semiconductor device," whereas the body 120C is yet another example of the "cooling body."

The body 120C is similar to the body 120 except for including a partition 124Ca instead of the partition 124a shown in FIG. 3. The partition 124Ca is yet another example of the "partition."

The partition 124Ca is similar to the partition 124a, not only except that the protrusions CV1 and CV2 shown in FIG. 3 are not formed, but also except that the surface SFa11 is formed to be tilted. For example, a wall portion DW1 of the partition 124Ca positioned in the +X direction from the partition 124b is tilted toward the X-Y plane, whereas a wall portion DW2 of the partition 124Ca positioned in the −X direction from the partition 124b is substantially parallel to the X-Y plane. Accordingly, in the surface SFa10 of the partition 124Ca, a surface SFa10 of the wall portion DW1 is tilted toward the X-Y plane, whereas a surface SFa10 of the wall portion DW2 is substantially parallel to the X-Y plane. Among surfaces of the partition 124Ca opposite to the surface Sfa10, a surface SFa11 of the wall portion DW1, which constitutes a part of the wall surface of the inflow path FP1, is tilted toward the X-Y plane, whereas a surface SFa12 of the wall portion DW2, which constitutes a part of the wall surface of the outflow path FP2, is substantially parallel to the X-Y plane.

For example, the surface SFa11 of the wall portion DW1 includes two edges along the Y direction. The surface SFa11 of the wall portion DW1 is tilted such that one of the two edges (a first edge close to the surface SFa20) is not only closer to a communication portion that causes the inflow path FP1 and the plurality of cooling paths FP3 to communicate with each other than the other of the two edges (a second edge), but is also farther from the outer wall 122a than the other of the two edges. In other words, a portion at which the surface SFa11 of the partition 124Ca intersects the surface SFa20 is positioned in the −Z direction apart from a portion at which the surface SFa11 intersects the surface SFb1 of the partition 124b.

As described above, in the embodiment, the partition 124Ca is formed so that the surface SFa11, which constitutes a part of the wall surface of the inflow path FP1, includes the first portion and the second portion of which positions in the Z direction are different from each other, for example. In the embodiment, one of the two edges of the surface SFa11 along the Y direction corresponds to the first portion, whereas the other of the two edges of the surface SFa11 along the Y direction corresponds to the second portion. A space defined by the surface SFa11 of the wall portion DW1 and the surface SFb1 of the partition 124b corresponds to the gas retaining space SPar1. Thus, in the embodiment, the inflow path FP1 includes the gas retaining space SPar1, as in the first embodiment. Therefore, in the embodiment, it is possible to substantially prevent the gas AR in the inflow path FP1 from moving to the plurality of cooling paths FP3.

A configuration of the cooler 100C is not limited to the example shown in FIG. 10. For example, the outer wall 122a may include one or both of the curved surfaces CS1 and CS2 shown in FIG. 8, and alternatively, one or both of the tilted surfaces TS1 and TS2 shown in FIG. 9. In this case, it is possible to obtain effects similar to those in the second embodiment and the third embodiment described above.

The cooler 100C may include the partition 124Ba shown in FIG. 9 instead of the partition 124Ca, for example. Alternatively, the wall portion DW2 of the partition 124Ca may be tilted toward the X-Y plane. For example, the surface SFa12 of the wall portion DW2, which includes two edges along the Y direction, may be tilted such that one of the two edges (an edge close to the surface SFa30) is not only closer to a communication portion that causes the outflow path FP2 and the plurality of cooling paths FP3 to communicate with each other than the other of the two edges, but is also farther from the outer wall 122a than the other of the two edges. In this case, the outflow path FP2 includes the gas retaining space SPar2 defined by the surface SFa12 of the wall portion DW2 and the surface SFb2 of the partition 124b; therefore, it is possible to substantially prevent gas AR in the outflow path FP2 from moving to the plurality of cooling paths FP3.

The partition 124c may be formed to be connected to the surface SFa10 of the wall portion DW1, for example. For example, in plan view from the −Y direction, the partition 124c may be formed such that a portion of the partition 124c in the +X direction from the partition 124b has a trapezoidal shape including a side parallel to the surface SFa10.

As described above, in the embodiment, the surface SFa11, which constitutes a part of the wall surface of the inflow path FP1 and includes two edges along the Y direction, is tilted such that one of the two edges (the edge close to the surface SFa20), which is closer to the communication portion that causes the inflow path FP1 and the plurality of cooling paths FP3 to communicate with each other than the other of the two edges, is farther from the outer wall 122a than the other of the two edges. In the embodiment, the gas retaining space SPar1 is defined by the first portion, which is one of the two edges of the surface SFa11 along the Y direction, and the second portion, which is the other of the two edges of the surface SFa11 along the Y direction. In the embodiment, the inflow path FP1 includes the gas retaining space SPar1, as in the first embodiment. Therefore, it is possible to obtain effects similar to those in the first embodiment described above.

B: Modifications

The embodiments described above may be variously modified. Specific modifications, which can be applied to the embodiments described above, are described below. Two or more modifications freely selected from the following modifications may be combined as long as no conflict arises from such combination.

B1: First Modification

In the embodiment described above, the cooler 100 including the head 140 is described; however, the present disclosure is not limited to such a configuration. For example, the cooler 100 may not include the head 140.

Figure 11:
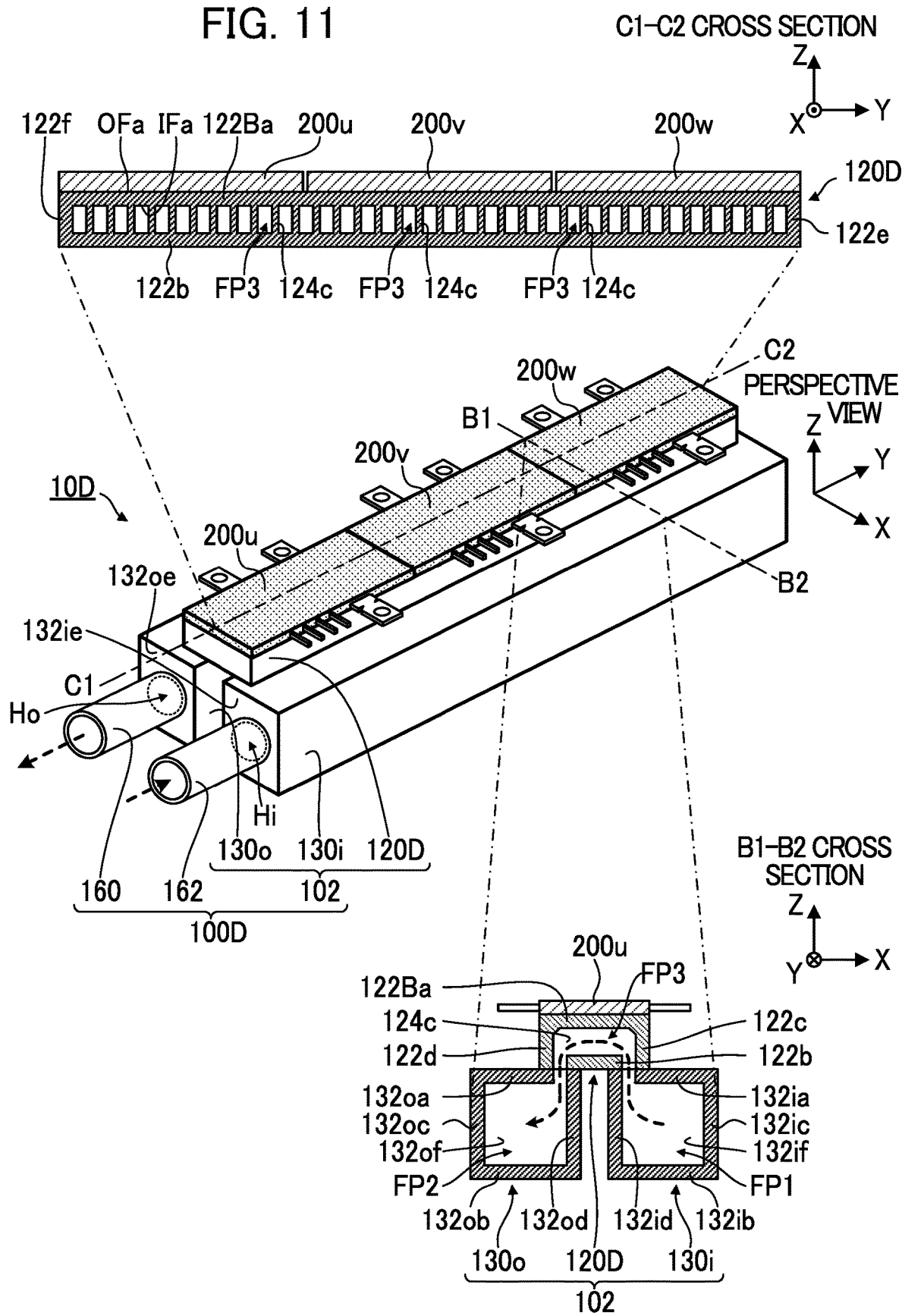
FIG. 11 is a diagram explaining an example of a power converter according to a first modification.

FIG. 11 is a diagram explaining an example of a power converter 10D according to a first modification. FIG. 11 shows a perspective view, a B1-B2 cross section, and a C1-C2 cross section of the power converter 10D. The B1-B2 cross section in FIG. 11 is a cross section of the power converter 10D taken along line B1-B2 in the perspective view in FIG. 11. The C1-C2 cross section in FIG. 11 is a cross section of a cooling pipe 120D and the semiconductor module 200 taken along line C1-C2 in the perspective view in FIG. 11. Dashed arrows in FIG. 11 indicate flow of refrigerant. Elements substantially the same as the elements described with reference to FIG. 1 to FIG. 10 are denoted with like reference signs, and detailed explanations thereof are omitted.

The power converter 10D includes, for example, the three semiconductor modules 200u, 200v, and 200w, and a cooler 100D for cooling the semiconductor modules 200u, 200v, and 200w. The cooler 100D includes a body 102 extending in the Y direction, the supply pipe 160, and the drain pipe 162. The power converter 10D is yet another example of the "semiconductor device," whereas the body 102 is yet another example of the "cooling body."

The body 102 includes the cooling pipe 120D, a transport pipe 130i, and a transport pipe 130o. The cooling pipe 120D includes the plurality of cooling paths FP3 arrayed in the Y direction. Each of the plurality of cooling paths FP3 extends in the X direction. The transport pipe 130i includes the inflow path FP1 extending in the Y direction. The transport pipe 130o includes the outflow path FP2 extending in the Y direction.

The cooling pipe 120D includes, for example, outer walls 122Ba and 122b that are substantially parallel to the X-Y plane, outer walls 122c and 122d that are substantially parallel to the Y-Z plane, and outer walls 122e and 122f that are substantially parallel to the X-Z plane. A space, which causes the inflow path FP1 and the plurality of cooling paths FP3 to communicate with each other, is provided between an edge of the outer wall 122b in the +X direction and the outer wall 122c. Similarly, a space, which causes the outflow path FP2 and the plurality of cooling paths FP3 to communicate with each other, is provided between an edge of the outer wall 122b in the −X direction and the outer wall 122d. In other words, the cooling pipe 120D is a hollow rectangular parallelepiped that includes an opening communicating with the inflow path FP1 and an opening communicating with the outflow path FP2.

The cooling pipe 120D includes the plurality of partitions 124c arrayed in the Y direction, and each of the plurality of partitions 124c extends in the X direction. Each of the plurality of partitions 124c, which is, for example, a wall substantially parallel to the X-Z plane, is connected to the outer walls 122Ba, 122b, 122c, and 122d. Each of the plurality of partitions 124c may not be connected to one of the outer walls 122Ba and 122b. Alternatively, each of the plurality of partitions 124c may not be connected to either the outer walls 122c or 122d. The plurality of partitions 124c divides a space in the cooling pipe 120D into the plurality of cooling paths FP3. The semiconductor module 200 is arranged on the outer wall 122Ba of the cooling pipe 120D, and the inner surface IFa of the outer wall 122Ba constitutes a part of the wall surfaces of the plurality of cooling paths FP3.

The transport pipe 130i includes, for example, outer walls 132ia and 132ib that are substantially parallel to the X-Y plane, outer walls 132ic and 132id that are substantially parallel to the Y-Z plane, and outer walls 132ie and 132if that are substantially parallel to the X-Z plane. A space, which causes the inflow path FP1 and the plurality of cooling paths FP3 to communicate with each other, is provided between an edge of the outer wall 132ia in the −X direction and the outer wall 132id. The outer wall 132ie includes a supply port Hi penetrating the outer wall 132ie. The transport pipe 130i is a hollow rectangular parallelepiped that includes the supply port Hi and an opening communicating with the plurality of cooling paths FP3.

The transport pipe 130o includes, for example, outer walls 132oa and 132ob that are substantially parallel to the X-Y plane, outer walls 132oc and 132od that are substantially parallel to the Y-Z plane, and outer walls 132oe and 132of that are substantially parallel to the X-Z plane. A space, which causes the outflow path FP2 and the plurality of cooling paths FP3 to communicate with each other, is provided between an edge of the outer wall 132oa in the +X direction and the outer wall 132od. The outer wall 132oe includes a drain port Ho penetrating the outer wall 132oe. The transport pipe 130o is a hollow rectangular parallelepiped that includes the drain port Ho and an opening communicating with the plurality of cooling paths FP3.

The cooling pipe 120D is connected to the outer walls 132ia and 132id of the transport pipe 130i and the outer walls 132oa and 132od of the transport pipe 130o. Thus, each of the plurality of cooling paths FP3 causes the inflow path FP1 and the outflow path FP2 to communicate with each other in the X direction. In the modification, the plurality of cooling paths FP3 is positioned in the Z direction not only between the inflow path FP1 and the outer wall 122Ba, but also between the outflow path FP2 and the outer wall 122Ba.

The shapes of the cooling pipe 120D, the transport pipe 130i, and the transport pipe 130o are each not limited to the rectangular parallelepiped extending in the Y direction. For example, the shapes of the transport pipes 130i and 130o in plan view from the −Y direction may be each a shape having a curve. Similarly, the shape of the cooling pipe 120D in plan view from the −Y direction may be a shape having a curve.

The outer wall 132ib of the transport pipe 130i may be formed integrally with the outer wall 132ob of the transport pipe 130o. In this case, the transport pipes 130i and 130o may include a common partition (for example, the same partition as the partition 124a shown in FIG. 3) that separates the inflow path FP1 and the outflow path FP2 from each other, instead of the outer walls 132id and 132od.

As described above, in the modification, it is possible to obtain effects similar to those in the second embodiment described above. In the modification, the head 140 is not provided; therefore, the size of the cooler 100D in the Y direction can be reduced.

B2: Second Modification

In the embodiments and the modifications described above, a configuration is described in which each of the cooling paths FP3 includes two ends. One of the two ends communicates with the inflow path FP1. The other of the two ends communicates with the outflow path FP2. However, the present disclosure is not limited to this configuration. For example, each of the cooling paths FP3 may communicate with the inflow path FP1 near an intermediate portion in the X direction between the inner surface IFc of the outer wall 122c and the surface SFb1 of the partition 124b, and each of the cooling paths FP3 may communicate with the outflow path FP2 near an intermediate portion in the X direction between the inner surface IFd of the outer wall 122d and the surface SFb2 of the partition 124b. As described above, in the modification, it is possible to obtain effects similar to those in the embodiments and modifications described above.

DESCRIPTION OF REFERENCE SIGNS 10, 10A, 10B, 10C, 10D, 10Z . . . power converter, 100, 100A, 100B, 100C, 100D, 100Z . . . cooler, 102, 120, 120A, 120B, 120C, 120Z . . . body, 122a, 122Aa, 122Ba, 122b, 122c, 122d, 122e, 122ea, 122eb, 132ia, 132oa, 132ib, 132ob, 132ic, 132oc, 132id, 132od, 132ie, 132oe, 142a, 142c, 142e, 142f . . . outer wall, 124a, 124Aa, 124Ba, 124Ca, 124b, 124c, 144 . . . partition, 120D . . . cooling pipe, 130i, 130o . . . transport pipe, 140 . . . head, 160 . . . supply pipe, 162 . . . drain pipe, 200u, 200v, 200w . . . semiconductor module, 202u, 202v, 202w, 204u, 204v, 204w . . . input terminal, 206u, 206v, 206w . . . output terminal, 208u, 208v, 208w . . . control terminal, 300 . . . capacitor, 400 . . . control board, 500 . . . housing, 520 . . . input connector, 540 . . . output connector, BSE . . . base, CP1, CP2 . . . recess, CV1, CV2 . . . protrusion, DW1, DW2 . . . wall portion, FP1 . . . inflow path, FP2 . . . outflow path, FP3 . . . cooling path, Hi . . . supply port, Ho . . . drain port, IFa, IFb, IFb1, IFb2, IFc, IFd . . . inner surface, OFa . . . outer surface, SFa10, SFa11, SFa12, SFa20, SFa21, SFa22, SFa30, SFa31, SFa32, SFb1, SFb2 . . . surface, SPar1, Spar2 . . . gas retaining space.

What is claimed is:

1. A cooler comprising a cooling body extending in a first direction, wherein:
the cooling body includes:
a cooling wall including a first surface on which a heat generator is arranged, and a second surface opposite to the first surface;
a first flow path extending in the first direction and having one end from which a refrigerant flows into the first flow path;
a second flow path extending in the first direction and having one end from which the refrigerant is drained;
a plurality of cooling paths each having a wall surface, a part of the wall surface being constituted by the second surface; and
a partition spaced apart from the cooling wall in a third direction perpendicular to the first surface, the partition separating the first flow path from the plurality of cooling paths, and the partition separating the second flow path from the plurality of cooling paths,
the plurality of cooling paths is arrayed in the first direction, each of the plurality of cooling paths extending in a second direction intersecting the first direction, each of the plurality of cooling paths being between the first flow path and the cooling wall in the third direction, and each of the plurality of cooling paths being between the second flow path and the cooling wall in the third direction,
each of the plurality of cooling paths causes the first flow path and the second flow path to communicate with each other in the second direction,
the partition includes a third surface constituting a part of a wall surface of the first flow path, the third surface including a first portion and a second portion, and a position of the first portion in the third direction being different from a position of the second portion in the third direction, and
the first flow path includes a first gas retaining space defined by the first portion and the second portion.

2. The cooler according to claim 1, wherein:
the partition includes a fourth surface constituting a part of a wall surface of the second flow path, the fourth surface including a third portion and a fourth portion, and a position of the third portion in the third direction being different from a position of the fourth portion in the third direction, and
the second flow path includes a second gas retaining space defined by the third portion and the fourth portion.

3. The cooler according to claim 1, wherein:
the partition includes: two edges along the first direction; and a protrusion protruding in a direction away from the cooling wall from an edge closest to the first flow path among the two edges,
the first portion is an end portion of the protrusion, and
the second portion is a portion of the third surface on which the protrusion is not present.

4. The cooler according to claim 1, wherein:
the third surface includes two edges along the first direction, the two edges having a first edge and a second edge, the first edge being closer to a communication portion than the second edge, and the communication portion causing the first flow path and the plurality of cooling paths to communicate with each other, and the third surface being tilted such that the first edge is farther from the cooling wall than the second edge,
the first portion is one of the two edges of the third surface along the first direction, and
the second portion is the other of the two edges of the third surface along the first direction.

5. The cooler according to claim 1, wherein:
the third surface includes a plurality of recesses,
the first portion is a bottom surface of each of the plurality of recesses, and
the second portion is a tip of each of a plurality of protrusions formed by the plurality of recesses.

6. A cooler comprising a cooling body extending in a first direction, wherein:

the cooling body includes:

a cooling wall including a first surface on which a heat generator is arranged, and a second surface opposite to the first surface;

a first flow path extending in the first direction and having one end from which a refrigerant flows into the first flow path;

a second flow path extending in the first direction and having one end from which the refrigerant is drained; and a plurality of cooling paths each having a wall surface, a part of the wall surface being constituted by the second surface;

the plurality of cooling paths is arrayed in the first direction, each of the plurality of cooling paths extending in a second direction intersecting the first direction, each of the plurality of cooling paths being between the first flow path and the cooling wall in a third direction perpendicular to the first surface, and each of the plurality of cooling paths being between the second flow path and the cooling wall in the third direction, each of the plurality of cooling paths causes the first flow path and the second flow path to communicate with each other in the second direction, and the second surface includes a peripheral portion close to the second flow path in the second direction, the peripheral portion close to the second flow path being a tilted surface or a curved surface, wherein the first flow path includes a first gas retaining space.

7. The cooler according to claim 6, wherein the second surface includes a peripheral portion close to the first flow path in the second direction, the peripheral portion close to the first flow path being a tilted surface or a curved surface.

8. The cooler according to claim 6, wherein:

the cooling body includes a partition spaced apart from the cooling wall in the third direction, the partition separating the first flow path from the plurality of cooling paths, and the partition separating the second flow path from the plurality of cooling paths, the partition includes a third surface constituting a part of a wall surface of the first flow path, the third surface including a first portion and a second portion, and a position of the first portion in the third direction being different from a position of the second portion in the third direction, and the first flow path includes the first gas retaining space defined by the first portion and the second portion.

9. A semiconductor device comprising a cooler, wherein:

the cooler includes a cooling body extending in a first direction, the cooling body includes:

a cooling wall including a first surface on which a heat generator is arranged, and a second surface opposite to the first surface;

a first flow path extending in the first direction and having one end from which a refrigerant flows into the first flow path;

a second flow path extending in the first direction and having one end from which the refrigerant is drained;

a plurality of cooling paths each having a wall surface, a part of the wall surface being constituted by the second surface;

a partition spaced apart from the cooling wall in a third direction perpendicular to the first surface, the partition separating the first flow path from the plurality of cooling paths, and the partition separating the second flow path from the plurality of cooling paths, the plurality of cooling paths is arrayed in the first direction, each of the plurality of cooling paths extending in a second direction intersecting the first direction, each of the plurality of cooling paths being between the first flow path and the cooling wall in the third direction, and each of the plurality of cooling paths being between the second flow path and the cooling wall in the third direction, each of the plurality of cooling paths causes the first flow path and the second flow path to communicate with each other in the second direction, the partition includes a third surface constituting a part of a wall surface of the first flow path, the third surface including a first portion and a second portion, and a position of the first portion in the third direction being different from a position of the second portion in the third direction, and the first flow path includes a first gas retaining space defined by the first portion and the second portion.

\* \* \* \* \*